United States Patent
Mizutani et al.

(10) Patent No.: US 7,625,690 B2
(45) Date of Patent: Dec. 1, 2009

(54) POSITIVE RESIST COMPOSITION AND PATTERN FORMING METHOD USING THE SAME

(75) Inventors: Kazuyoshi Mizutani, Shizuoka (JP); Kaoru Iwato, Shizuoka (JP); Kunihiko Kodama, Shizuoka (JP); Masaomi Makino, Shizuoka (JP); Toru Tsuchihashi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 28 days.

(21) Appl. No.: 11/717,618

(22) Filed: Mar. 14, 2007

(65) Prior Publication Data
US 2007/0218406 A1 Sep. 20, 2007

(30) Foreign Application Priority Data
Mar. 14, 2006 (JP) ............................ 2006-069382
Sep. 12, 2006 (JP) ............................ 2006-247244

(51) Int. Cl.
*G03F 7/004* (2006.01)
*G03F 7/30* (2006.01)

(52) U.S. Cl. ................ 430/270.1; 430/326; 430/905; 430/907; 430/910

(58) Field of Classification Search ............... 430/270.1, 430/905, 910, 326, 907
See application file for complete search history.

(56) References Cited

U.S. PATENT DOCUMENTS

| | | | |
|---|---|---|---|
| 5,561,194 A | | 10/1996 | Cornett et al. |
| 5,919,601 A | * | 7/1999 | Nguyen et al. ........... 430/278.1 |
| 6,312,870 B1 | | 11/2001 | Malik et al. |
| 6,806,019 B2 | * | 10/2004 | Takahashi .................. 430/165 |
| 2003/0022103 A1 | | 1/2003 | Lee et al. |
| 2003/0165770 A1 | * | 9/2003 | Lee et al. .................... 430/191 |
| 2008/0076062 A1 | * | 3/2008 | Makino .................... 430/270.1 |
| 2008/0081289 A1 | * | 4/2008 | Nishiyama et al. ....... 430/285.1 |

FOREIGN PATENT DOCUMENTS

| | | |
|---|---|---|
| EP | 0 284 868 A2 | 10/1988 |
| EP | 0 337 258 A2 | 10/1989 |
| EP | 0 663 616 A2 | 12/1994 |
| EP | 0829766 A2 | 3/1998 |
| EP | 1 273 969 A2 | 1/2003 |
| JP | 58-068743 A | 4/1983 |
| JP | 7-234511 A | 9/1995 |
| JP | 2001-166474 A | 6/2001 |
| JP | 2001-166478 A | 6/2001 |
| JP | 2001-194792 A | 7/2001 |
| JP | 2003-107708 A | 4/2003 |

OTHER PUBLICATIONS

Ichimura K, et al; "Highly Sensitive Positive Resists for Holography"; Proceedings of the Spie—The International Society for Optical Engineering; vol. 1212, 1990, pp. 73-75, XP002475596.

* cited by examiner

*Primary Examiner*—John S Chu
(74) *Attorney, Agent, or Firm*—Sughrue Mion, PLLC

(57) ABSTRACT

A resist composition, which comprises: (A) a resin containing a repeating unit represented by formula (I); and (B) a compound capable of generating an acid upon irradiation with actinic rays or radiation:

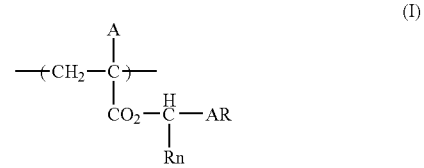

wherein AR represents an aryl group; Rn represents an alkyl group, a cycloalkyl group or an aryl group; and A represents an atom or group selected from the group consisting of a hydrogen atom, an alkyl group, a halogen atom, a cyano group and an alkyloxycarbonyl group, and a pattern forming method using the resist composition.

19 Claims, No Drawings

POSITIVE RESIST COMPOSITION AND PATTERN FORMING METHOD USING THE SAME

BACKGROUND OF THE INVENTION

1. Field of the Invention

The present invention relates to a positive resist composition suitable for use in the ultramicrolithography process such as production of VLSI or a high-capacity microchip or in other photofabrication processes. More specifically, the present invention relates to a positive resist composition capable of forming a high-resolution pattern by using KrF excimer laser light, electron beam, EUV light or the like, that is, a positive resist composition suitably usable for fine processing of a semiconductor device, where KrF excimer laser light, electron beam or EUV light is used, and a pattern forming method using the composition.

2. Description of the Related Art

In the process of producing a semiconductor device such as IC and LSI, fine processing by lithography using a photoresist composition has been conventionally performed. Recently, the integration degree of an integrated circuit is becoming higher and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using electron beam, X ray or EUV light is proceeding.

The lithography using electron beam or EUV light is positioned as a next-generation or next-next-generation pattern formation technique and a high-sensitivity and high-resolution positive resist is being demanded. Particularly, in order to shorten the wafer processing time, the elevation of sensitivity is very important, but in the positive resist for electron beam or EUV, when higher sensitivity is sought for, not only reduction in the resolving power but also worsening of the defocus latitude depended on line pitch are incurred and development of a resist satisfying these properties at the same time is strongly demanded. The defocus latitude depended on line pitch as used herein means a difference in the pattern dimension between a high density portion and a low density portion of a resist pattern and when this difference is large, the process margin is disadvantageously narrowed at the actual pattern formation. How to reduce this difference is one of important problems to be solved in the resist technology development. The high sensitivity is in a trade-off relationship with high resolution, good pattern profile and good defocus latitude depended on line pitch and it is very important how to satisfy these properties at the same time.

Furthermore, also in the lithography using KrF excimer laser light, how to satisfy all of high sensitivity, high resolution, good pattern profile and good defocus latitude depended on line pitch is an important problem, and this problem needs to be solved.

As for the resist suitable for such a lithography process using KrF excimer laser light, electron beam or EUV light, a chemical amplification-type resist utilizing an acid catalytic reaction is mainly used from the standpoint of elevating the sensitivity and in the case of a positive resist, a chemical amplification-type resist composition mainly comprising an acid generator and a phenolic polymer which is insoluble or sparingly soluble in an alkali developer but becomes soluble in an alkali developer under the action of an acid (hereinafter simply referred to as a "phenolic acid-decomposable resin"), is being effectively used.

With respect to such a positive resist, there are known some resist compositions using a phenolic acid-decomposable resin obtained by copolymerizing an acid-decomposable acrylate monomer having an alicyclic group as the acid-decomposable group. Examples thereof include the positive resist compositions disclosed in U.S. Pat. No. 5,561,194, JP-A-2001-166474 (the term "JP-A" as used herein means an "unexamined published Japanese patent application"), JP-A-2001-166478, JP-A-2003-107708 and JP-A-2001-194792.

In U.S. Pat. No. 6,312,870, a resist comprising a resin containing a repeating unit derived from a cinnamic acid ester is disclosed with an attempt to improve the pattern profile and the etching resistance.

In JP-A-7-234511, a chemical amplification-type resist using a resin having a hydroxystyrene and a benzyl ester is disclosed.

However, by any combination of these techniques, it is impossible at present in the ultrafine region to satisfy all of high sensitivity, line width roughness and good defocus latitude depended on line pitch.

SUMMARY OF THE INVENTION

An object of the present invention is to solve the problems in the technology for enhancing the performance at the fine processing of a semiconductor device using actinic rays or radiation, particularly, KrF excimer laser light, electron beam or EUV light, and provide a positive resist composition capable of satisfying all of high sensitivity, line width roughness and good defocus latitude depended on line pitch and a pattern forming method using the composition.

The present inventors have made intensive studies, as a result, surprisingly, the object of the present invention can be attained by a positive resist composition comprising a resin using a blend of specific phenolic acid-decomposable resins differing in the structure, and a pattern forming method using the composition.

That is, the object of the present invention is attained by the following constructions.

(1) A resist composition, which comprises:

(A) a resin containing a repeating unit represented by formula (I); and (B) a compound capable of generating an acid upon irradiation with actinic rays or radiation:

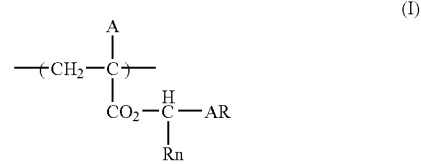

wherein AR represents an aryl group;

Rn represents an alkyl group, a cycloalkyl group or an aryl group; and

A represents an atom or group selected from the group consisting of a hydrogen atom, an alkyl group, a halogen atom, a cyano group and an alkyloxycarbonyl group.

(2) The resist composition as described in (1) above, wherein (A) the resin containing a repeating unit represented by formula (I) further contains a repeating unit represented by formula (A1):

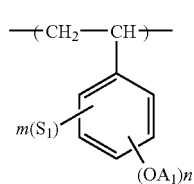

(A1)

wherein n represents an integer of 0 to 3;

m represents an integer of 0 to 3, provided that m+n≦5;

$A_1$ represents a group capable of decomposing under an action of an acid or a group containing a group capable of decomposing under an action of an acid, and when a plurality of $A_1$s are present, the plurality of $A_1$s may be the same or different; and $S_1$ represents a substituent, and when a plurality of $S_1$s are present, the plurality of $S_1$s may be the same or different.

(3) The resist composition as described in (2) above, wherein in the repeating unit represented by formula (A1), $A_1$ represents a group containing an acetal or ketal group.

(4) A resist composition, which comprises:

(A) a resin containing a repeating unit represented by formula (I') and a repeating unit represented by formula (A1'); and (B) a compound capable of generating an acid upon irradiation with actinic rays or radiation:

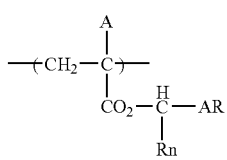

(I')

wherein AR represents an aryl group;

Rn represents an alkyl group having a carbon number of 2 to 18, a cycloalkyl group having a carbon number of 3 to 18 or an aryl group having a carbon number of 6 to 10; and A represents an atom or group selected from the group consisting of a hydrogen atom, an alkyl group, a halogen atom, a cyano group and an alkyloxycarbonyl group;

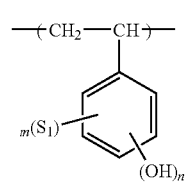

(A1')

wherein n represents an integer of 0 to 3;

m represents an integer of 0 to 3, provided that m+n≦5; and $S_1$ represents a substituent, and when a plurality of $S_1$s are present, the plurality of $S_1$s may be the same or different.

(5) The resist composition as described in any of (1) to (3) above, wherein (A) the resin containing a repeating unit represented by formula (I) further contains a repeating unit represented by formula (A2):

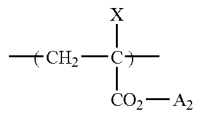

(A2)

wherein $A_2$ represents a group capable of decomposing under an action of an acid or a group containing a group capable of decomposing under an action of an acid; and X represents an atom or group selected from the group consisting of a hydrogen atom, an alkyl group, a halogen atom, a $CF_3$ group, a cyano group, an alkyloxycarbonyl group, an alkyloxycarbonylmethyl group, an alkylcarbonyloxymethyl group, a hydroxymethyl group and an alkoxymethyl group.

(6) The resist composition as described in (5) above, wherein in the repeating unit represented by formula (A2), $A_2$ represents a group containing a cyclic carbon structure.

(7) The resist composition as described in any of (1) to (6) above, wherein (A) the resin containing a repeating unit represented by formula (I) contains a repeating unit having a lactone group or a repeating unit having an alicyclic group substituted by a hydroxyl group.

(8) The resist composition as described in any of (1) to (7) above, wherein (A) the resin containing a repeating unit represented by formula (I) is partially crosslinked by a crosslinking group capable of decomposing under an action of an acid.

(9) The resist composition as described in any of (1) to (8) above, wherein (B) the compound capable of generating an acid upon irradiation with actinic rays or radiation is selected from the group consisting of an oxime sulfonate and a diazodisulfone.

(10) A pattern forming method, which comprises:

forming a resist film from a resist composition as described in any of (1) to (9) above; and exposing and developing the resist film.

DETAILED DESCRIPTION OF THE INVENTION

The compounds for use in the present invention are described in detail below.

Incidentally, in the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

The resist composition of the present invention comprises (A) a resin containing a repeating unit represented by formula (I) and (B) a compound capable of generating an acid upon irradiation with actinic rays or radiation.

[1] Resin Containing a Repeating Unit Represented by Formula (I)

The resist composition of the present invention comprises (A) a resin containing a repeating unit represented by formula (I).

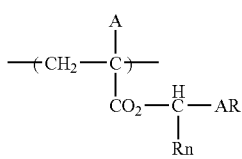

(I)

In formula (I), AR represents an aryl group. The aryl group is preferably a benzene ring or a naphthalene ring. This aryl group may have a substituent, and preferred examples of the substituent which the aryl group may have include an alkyl group, an aryl group, an aralkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. Among these, an alkyl group, an alkoxy group, a halogen atom, a nitro group, an acyl group and an acyloxy group are more preferred.

Rn represents an alkyl group, a cycloalkyl group or an aryl group.

A represents an atom or group selected from a hydrogen atom, an alkyl group, a halogen atom, a cyano group and an alkyloxycarbonyl group.

The alkyl group and the cycloalkyl group in Rn include a linear or branched alkyl group preferably having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group. This alkyl group may have a substituent, and preferred examples of the substituent which the alkyl group may have include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. Among these, an alkoxy group, a hydroxyl group, a halogen atom, a nitro group, an acyl group, an acyloxy group, an acylamino group and a sulfonylamino group are more preferred.

The aryl group in Rn is preferably an aryl group having a carbon number of 6 to 14, such as phenyl group, xylyl group, toluyl group, cumenyl group, naphthyl group and anthracenyl group.

Rn is preferably an alkyl group having a carbon number of 2 to 18 or an aryl group having a carbon number of 6 to 10 for being able to increase the sensitivity.

The alkyl group in A includes a linear or branched alkyl group preferably having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group. This alkyl group may have a substituent, and preferred examples of the substituent which the alkyl group may have include an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. Among these, a $CF_3$ group, an alkyloxycarbonylm- ethyl group, an alkylcarbonyloxymethyl group, a hydroxymethyl group and an alkoxymethyl group are more preferred.

The halogen atom in A includes a fluorine atom, a chlorine atom, a bromine atom and an iodine atom, with a fluorine atom being preferred.

Examples of the alkyl contained in the alkyloxycarbonyl group of A are the same as those of the alkyl group in A above.

Specific examples of the repeating unit represented by formula (I) are set forth below, but the present invention is not limited thereto.

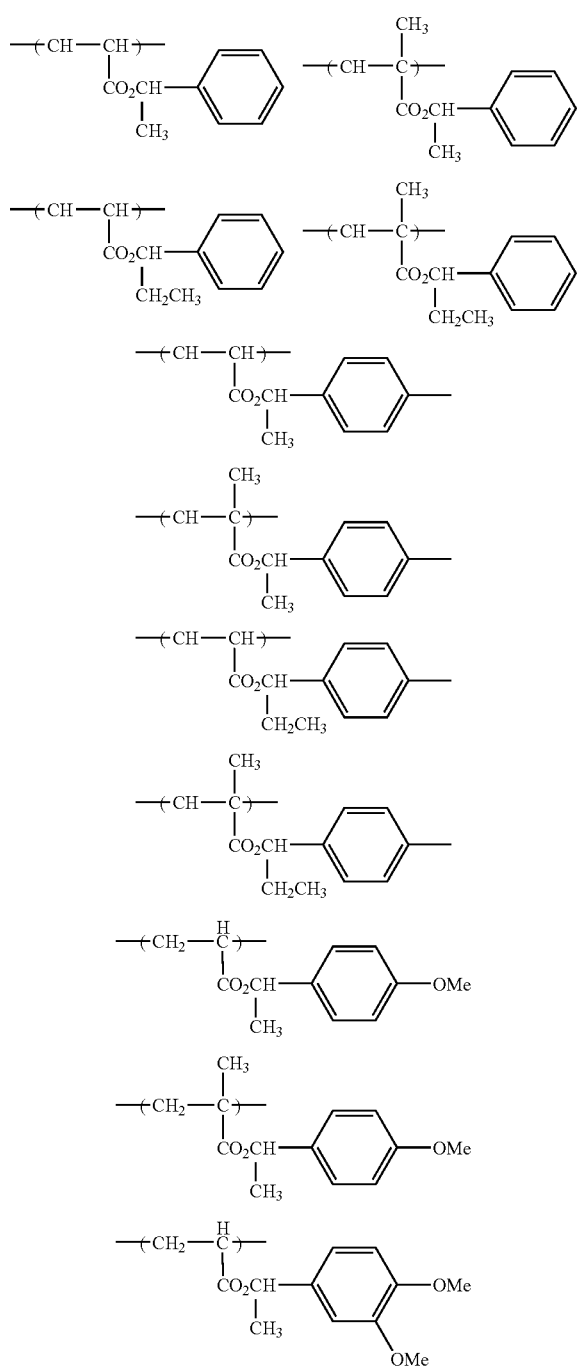

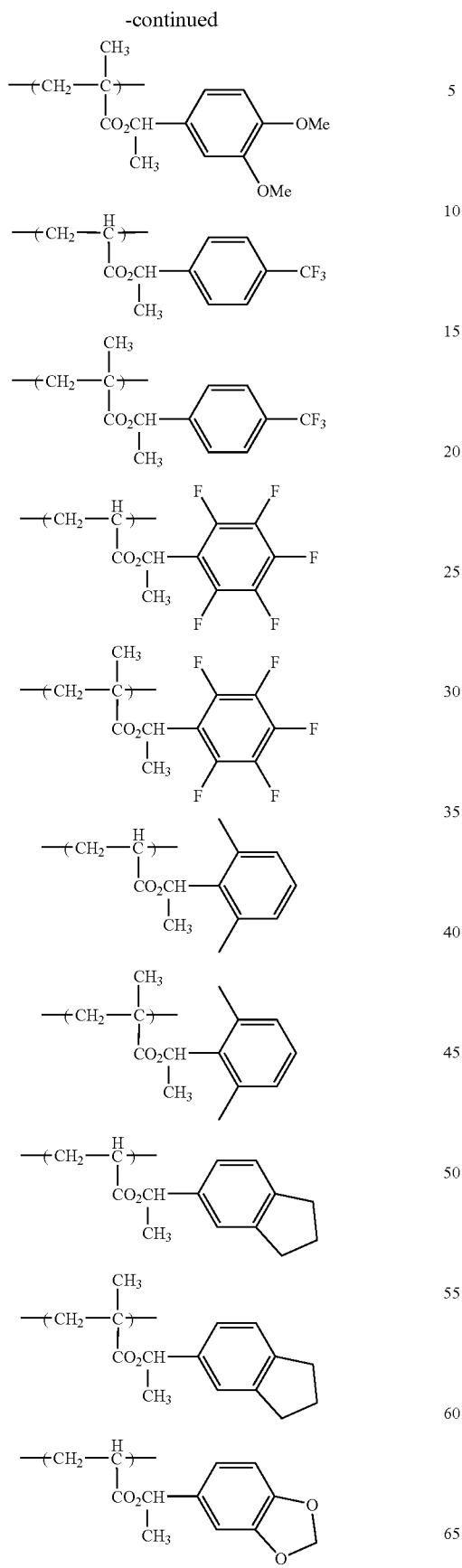
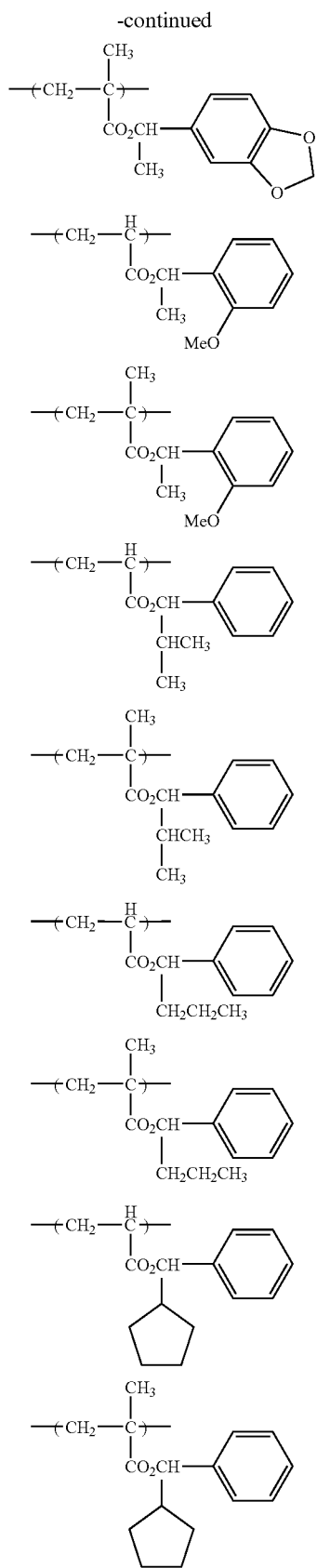

-continued

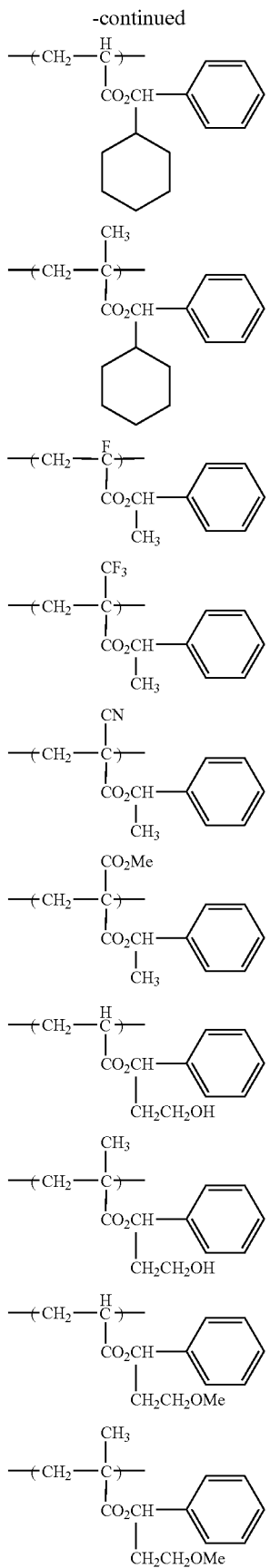

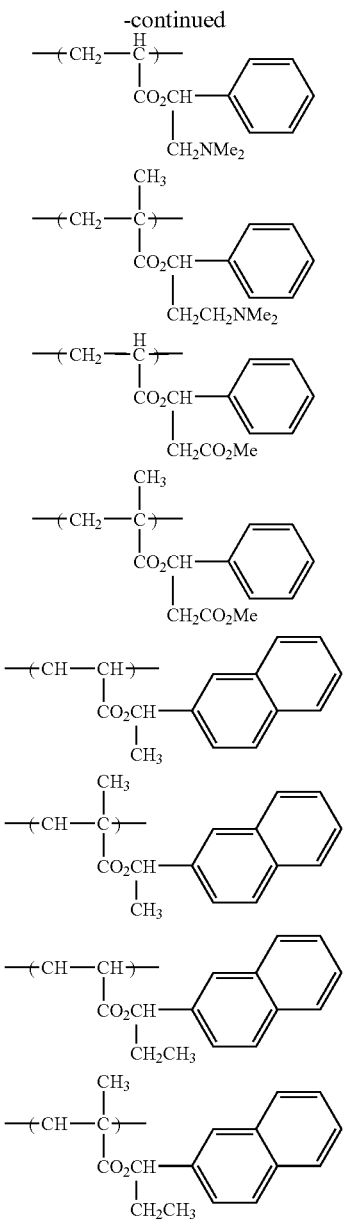

The (A) resin containing a repeating unit represented by formula (I) preferably further contains a repeating unit represented by formula (A1) and/or (A2).

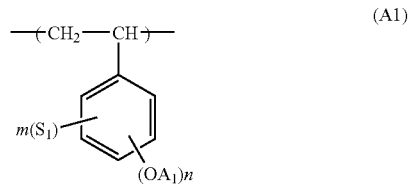

In formula (A1), n represents an integer of 0 to 3, and m represents an integer of 0 to 3, provided that $m+n \leq 5$.

$A_1$ represents a group capable of decomposing under the action of an acid or a group containing a group capable of decomposing under the action of an acid. When a plurality of $A_1$s are present, the plurality of $A_1$s may be the same or different.

Specific examples thereof include a tertiary alkyl group such as tert-butyl group and tert-amyl group, a tert-butoxycarbonyl group, a tert-butoxycarbonylmethyl group, and an acetal or ketal group represented by —$C(L_1)(L_2)$—O—Z.

$L_1$ and $L_2$, which may be the same or different, each represents an atom or group selected from a hydrogen atom, an alkyl group, a cycloalkyl group and an aralkyl group.

Z represents an alkyl group, a cycloalkyl group or an aralkyl group.

Z and $L_1$ may combine with each other to form a 5- or 6-membered ring.

n represents an integer of 0 to 4.

$S_1$ represents an arbitrary substituent, and when a plurality of $S_1$s are present, the plurality of $S_1$s may be the same or different. Examples thereof include an alkyl group, an alkoxy group, an acyl group, an acyloxy group, an aryl group, an aryloxy group, an aralkyl group, an aralkyloxy group, a hydroxy group, a halogen atom, a cyano group, a nitro group, a sulfonylamino group, an alkylthio group, an arylthio group and an aralkylthio group.

For example, the alkyl group or cycloalkyl group is preferably a linear or branched alkyl group or cycloalkyl group having a carbon number of 1 to 20, such as methyl group, ethyl group, propyl group, isopropyl group, n-butyl group, isobutyl group, tert-butyl group, pentyl group, cyclopentyl group, hexyl group, cyclohexyl group, octyl group and dodecyl group. This alkyl or cycloalkyl group may further have a substituent.

Preferred examples of the substituent which the alkyl or cycloalkyl group may further have include an alkyl group, an alkoxy group, a hydroxyl group, a halogen atom, a nitro group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue such as pyrrolidone residue. The substituent is preferably a substituent having a carbon number of 12 or less.

Examples of the alkyl group having a substituent include a cyclohexylethyl group, an alkylcarbonyloxymethyl group, an alkylcarbonyloxyethyl group, a cycloalkyl-carbonyloxymethyl group, a cycloalkylcarbonyloxyethyl group, an arylcarbonyloxyethyl group, an aralkylcarbonyloxyethyl group, an alkyloxymethyl group, a cycloalkyloxymethyl group, an aryloxymethyl group, an aralkyloxymethyl group, an alkyloxyethyl group, a cycloalkyloxyethyl group, an aryloxyethyl group, an aralkyloxyethyl group, an alkylthiomethyl group, a cycloalkylthiomethyl group, an arylthiomethyl group, an aralkylthiomethyl group, an alkylthioethyl group, a cycloalkylthioethyl group, an arylthioethyl group and an aralkylthioethyl group.

The alkyl group or cycloalkyl group in these groups is not particularly limited and may further have the above-described substituent such as alkyl group, cycloalkyl group and alkoxy group.

Examples of the alkylcarbonyloxyethyl group and cycloalkylcarbonyloxyethyl group include a cyclohexylcarbonyloxyethyl group, a tert-butylcyclohexylcarbonyloxyethyl group and an n-butylcyclohexylcarbonyloxyethyl group.

The aryl group is also not particularly limited but generally includes an aryl group having a carbon number of 6 to 14, such as phenyl group, xylyl group, toluyl group, cumenyl group, naphthyl group and anthracenyl group, and the aryl group may have the above-described substituent such as alkyl group, cycloalkyl group and alkoxy group.

Examples of the aryloxyethyl group include a phenyloxyethyl group and a cyclohexylphenyloxyethyl group. These groups each may further have a substituent.

The aralkyl is also not particularly limited but examples thereof include a benzyl group.

Examples of the aralkylcarbonyloxyethyl group include a benzylcarbonyloxyethyl group. This group may further have a substituent.

Examples of the aralkyl group in $L_1$, $L_2$ and Z include an aralkyl group having a carbon number of 7 to 15, such as benzyl group and phenethyl group. These groups each may have a substituent.

Preferred examples of the substituent which the aralkyl group has include an alkoxy group, a hydroxyl group, a halogen atom, a nitro group, an acyl group, an acylamino group, a sulfonylamino group, an alkylthio group, an arylthio group and an aralkylthio group. Examples of the aralkyl group having a substituent include an alkoxybenzyl group, a hydroxybenzyl group and a phenylthiophenethyl group.

The carbon number of the substituent which the aralkyl group in $L_1$, $L_2$ or Z can have is preferably 12 or less.

Examples of the 5- or 6-membered ring formed after Z and $L_1$ combine with each other include a tetrahydropyran ring and a tetrahydrofuran ring.

In the present invention, Z is preferably a linear or branched alkyl group. By virtue of this, the effects of the present invention are more remarkably exerted.

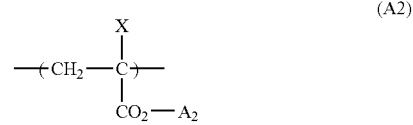

(A2)

In formula (A2), $A_2$ represents a group capable of decomposing under the action of an acid or a group containing a group capable of decomposing under the action of an acid.

$A_2$ is preferably a hydrocarbon group (preferably having a carbon number of 20 or less, more preferably from 4 to 12), more preferably a tert-butyl group, a tert-amyl group or an alicyclic structure-containing hydrocarbon group (for example, an alicyclic group itself or a group where an alicyclic group is substituted to an alkyl group).

The alicyclic structure may be either monocyclic or polycyclic. Specific examples thereof include a monocyclo, bicyclo, tricyclo or tetracyclo structure having a carbon number of 5 or more. The carbon number is preferably from 6 to 30, more preferably from 7 to 25. The alicyclic structure-containing hydrocarbon group may have a substituent.

X represents an atom or group selected from the group consisting of a hydrogen atom, an alkyl group, a halogen atom, a $CF_3$ group, a cyano group, an alkyloxycarbonyl group, an alkyloxycarbonylmethyl group, an alkylcarbonyloxymethyl group, a hydroxymethyl group and an alkoxymethyl group.

Examples of the alicyclic structure are set forth below.

(1)

-continued
(2)
(3)
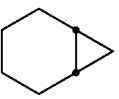
(4)
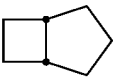
(5)
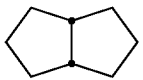
(6)
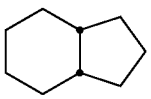
(7)
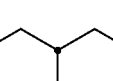
(8)
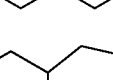
(9)
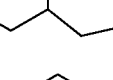
(10)
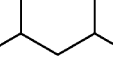
(11)
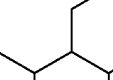
(12)
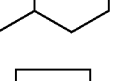
(13)
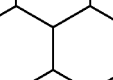
-continued
(14)
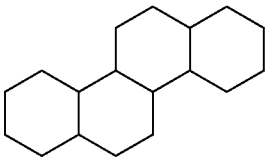
(15)
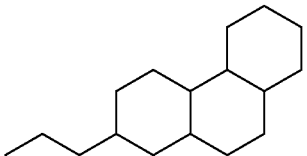
(16)
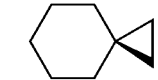
(17)
(18)
(19)
(20)
(21)
(22)
(23)
(24)
(25)

-continued
(26) 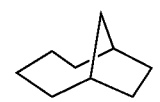
(27) 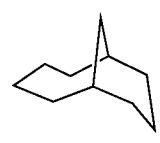
(28) 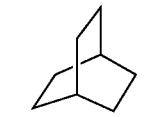
(29) 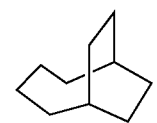
(30) 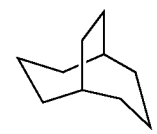
(31) 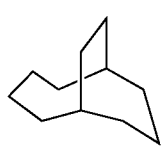
(32) 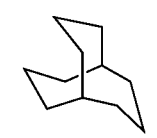
(33) 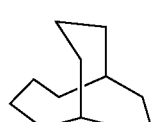
(34) 
(35) 
(36) 
(37) 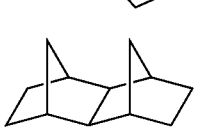
-continued
(38) 
(39) 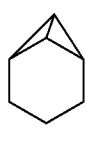
(40) 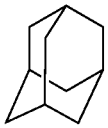
(41) 
(42) 
(43) 
(44) 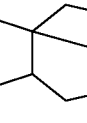
(45) 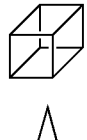
(46) 
(47) 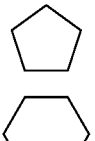
(48) 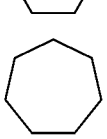
(49) 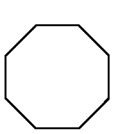
(50) 
In the present invention, among these alicyclic structures, preferred are, as denoted in terms of the monovalent alicyclic group, an adamantyl group, a noradamantyl group, a decalin residue, a tricyclodecanyl group, a tetracyclododecanyl group, a norbornyl group, a cedrol group, a cyclohexyl group, a cycloheptyl group, a cyclooctyl group, a cyclodecanyl group and a cyclododecanyl group, more preferred are an adamantyl group, a decalin residue, a norbornyl group, a cedrol group, a cyclohexyl group, a cycloheptyl group, a cyclooctyl group, a cyclodecanyl group and a cyclododecanyl group.

Examples of the substituent which the alicyclic ring in these structures may have include an alkyl group, a halogen atom, a hydroxyl group, an alkoxy group, a carboxyl group and an alkoxycarbonyl group. The alkyl group is preferably a lower alkyl group such as methyl group, ethyl group, propyl group, isopropyl group and butyl group, more preferably a methyl group, an ethyl group, a propyl group or an isopropyl group. The alkoxy group includes an alkoxy group having a carbon number of 1 to 4, such as methoxy group, ethoxy group, propoxy group and butoxy group. The alkyl group and the alkoxy group each may further have a substituent, and examples of the substituent which the alkyl group and alkoxy group may further have include a hydroxyl group, a halogen atom and an alkoxy group.

The acid-decomposable group having an alicyclic structure is preferably a group represented by any one of the following formulae (pI) to (pV):

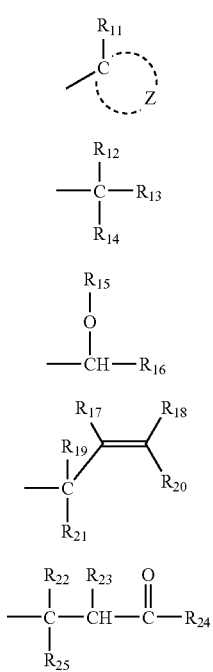

(pI)

(pII)

(pIII)

(pIV)

(pV)

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming an alicyclic hydrocarbon group together with the carbon atom.

$R_{12}$ to $R_{16}$ each independently represents a linear or branched alkyl group having a carbon number of 1 to 4 or an alicyclic hydrocarbon group, provided that at least one of $R_{12}$ to $R_{14}$ or either one of $R_{15}$ and $R_{16}$ represents an alicyclic hydrocarbon group.

$R_{17}$ to $R_{21}$ each independently represents a hydrogen atom, a linear or branched alkyl group having a carbon number of 1 to 4 or an alicyclic hydrocarbon group, provided that at least one of $R_{17}$ to $R_{21}$ represents an alicyclic hydrocarbon group. Also, either one of $R_{19}$ and $R_{21}$ represents a linear or branched alkyl group having a carbon number of 1 to 4 or an alicyclic hydrocarbon group.

$R_{22}$ to $R_{25}$ each independently represents a hydrogen atom, a linear or branched alkyl group having a carbon number of 1 to 4 or an alicyclic hydrocarbon group, provided that at least one of $R_{22}$ to $R_{25}$ represents an alicyclic hydrocarbon group. Also, $R_{23}$ and $R_{24}$ may combine with each other to form a ring.

In formulae (pI) to (pV), the alkyl group of $R_{12}$ to $R_{25}$ is a linear or branched alkyl group having from 1 to 4 carbon atoms, which may be substituted or unsubstituted, and examples of the alkyl group include a methyl group, an ethyl group, an n-propyl group, an isopropyl group, an n-butyl group, an isobutyl group, a sec-butyl group and a tert-butyl group.

Examples of the substituent which the alkyl group may further have include an alkoxy group having a carbon number of 1 to 4, a halogen atom (e.g., fluorine, chlorine, bromine, iodine), an acyl group, an acyloxy group, a cyano group, a hydroxyl group, a carboxy group, an alkoxycarbonyl group and a nitro group.

Examples of the alicyclic hydrocarbon group of $R_{11}$ to $R_{25}$ and the alicyclic hydrocarbon group formed by Z together with the carbon atom include those described above for the alicyclic structure.

Specific examples of the alicyclic structure-containing group capable of decomposing under the action of an acid or the group containing a group capable of decomposing under the action of an acid (acid-decomposable group), as $A_2$, are set forth below.

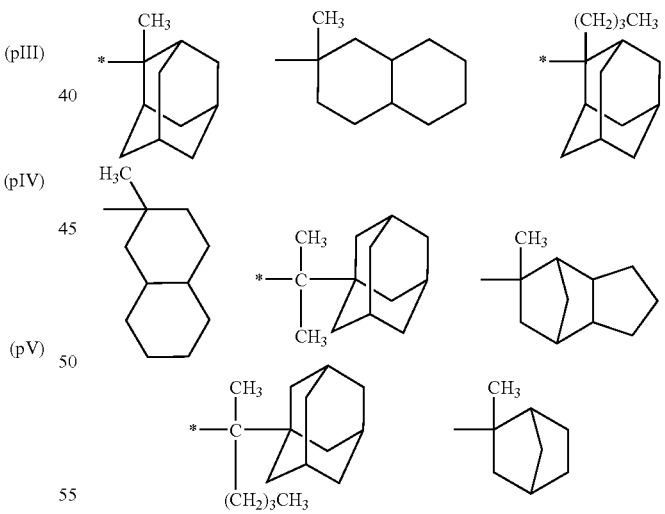

In the present invention, the group containing a group capable of decomposing under the action of an acid may be a group where as a result of desorption of $A_1$ or $A_2$, a hydroxyl group is produced in the repeating unit represented by formula (A1) or (A2), that is, an acid-decomposable group itself, or may be a group containing an acid decomposable group, that is, a group where as a result of decomposition under the action of an acid, an alkali-soluble group such as hydroxyl group and carboxyl group is produced in the residue bonded to the repeating unit.

The monomer corresponding to the repeating unit represented by formula (I) or (A2) may be synthesized by esterifying a (meth)acrylic acid chloride and an alcohol compound in a solvent such as THF, acetone and methylene chloride in the presence of a basic catalyst such as triethylamine, pyridine and DBU. A commercially available product may also be used.

The monomer corresponding to the repeating unit represented by formula (A1) may be synthesized by acetalizing a hydroxy-substituted styrene monomer and a vinyl ether compound in a solvent such as THF and methylene chloride in the presence of an acidic catalyst such as p-toluenesulfonic acid and pyridine p-toluenesulfonate, or by effecting t-Boc protection using tert-butyl dicarboxylic acid in the presence of a basic catalyst such as triethylamine, pyridine and DBU. A commercially available product may also be used.

Specific examples of the repeating unit represented by formula (A1) are set forth below, but the present invention is not limited thereto.

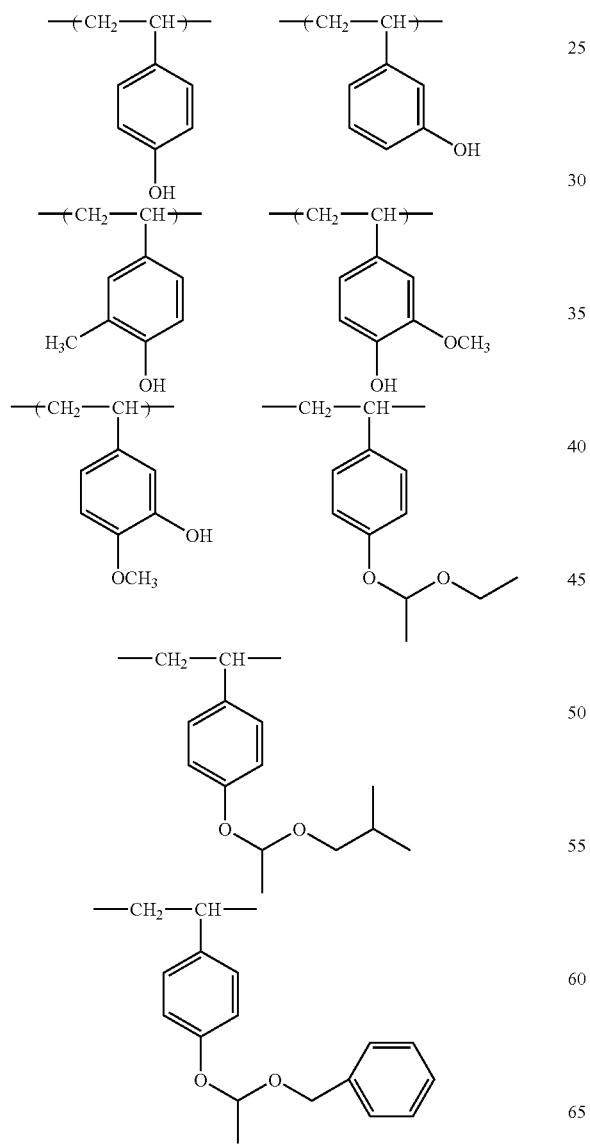

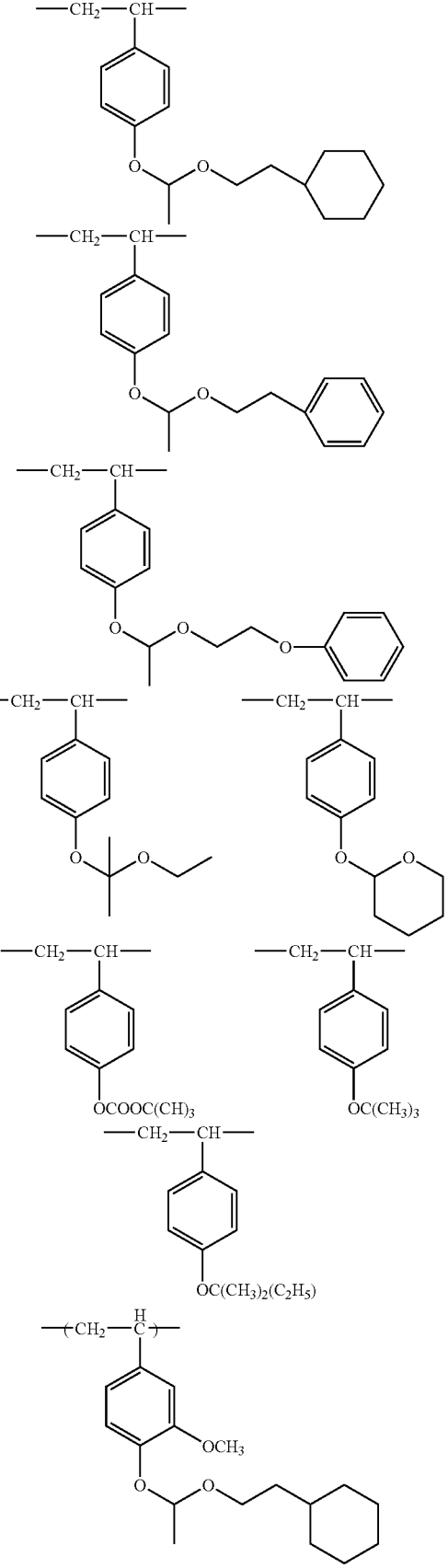

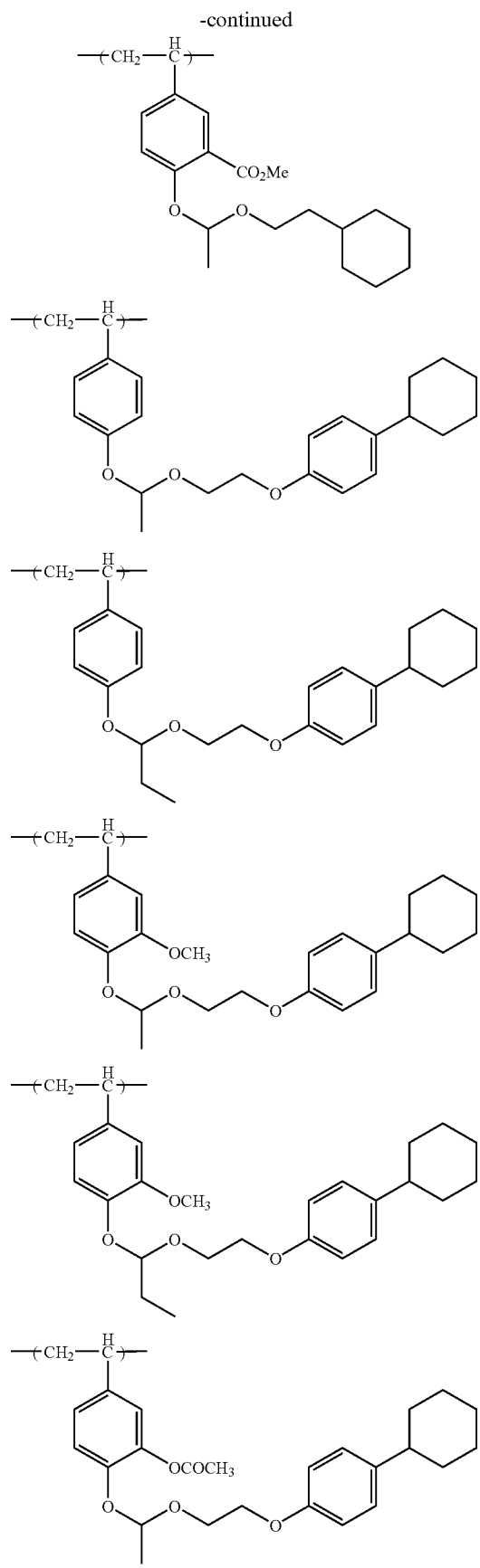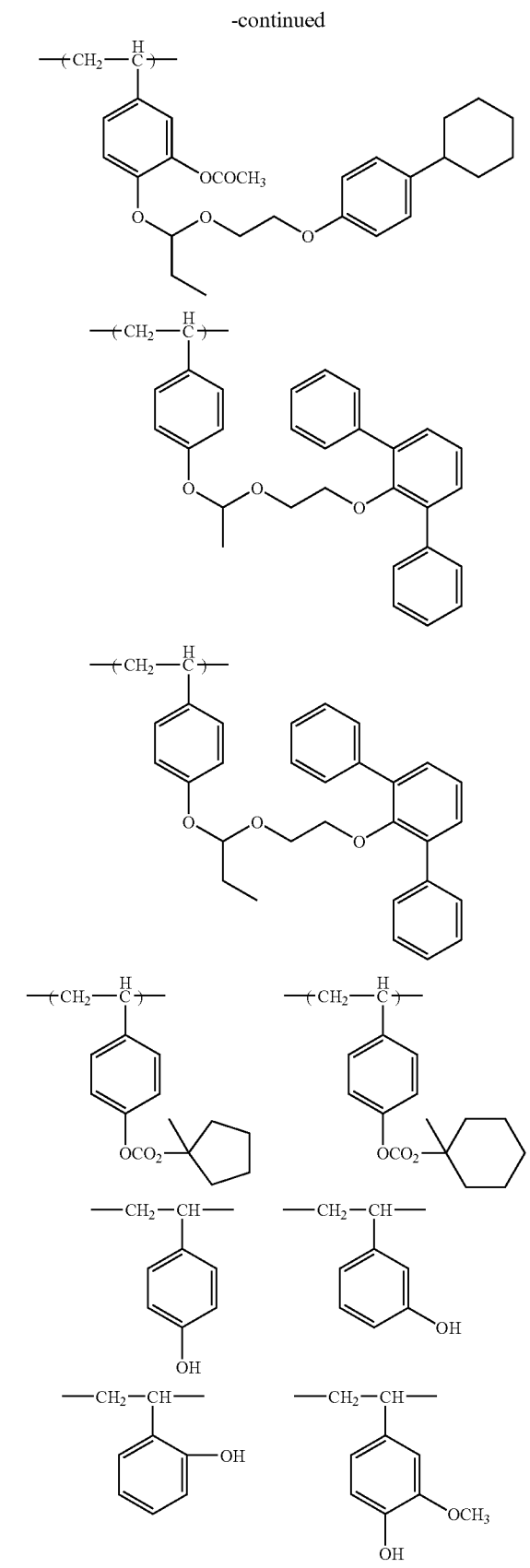

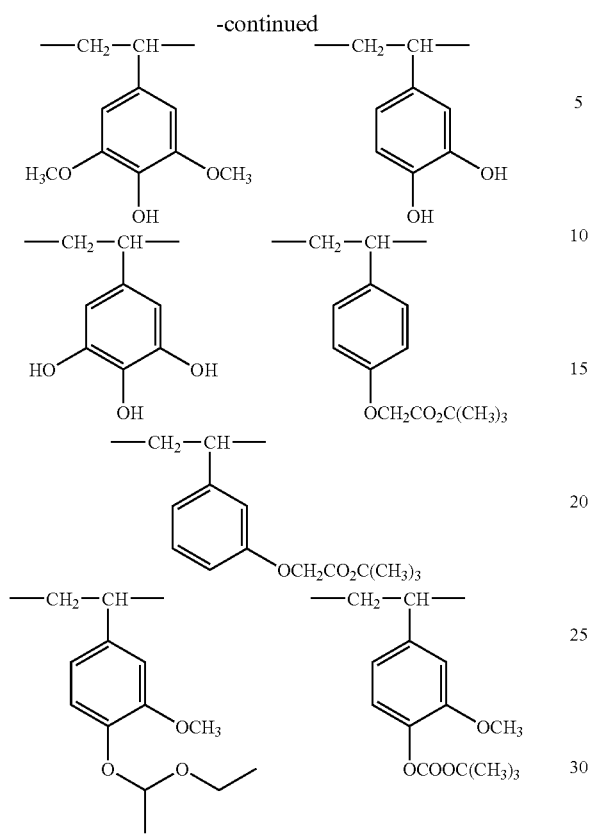
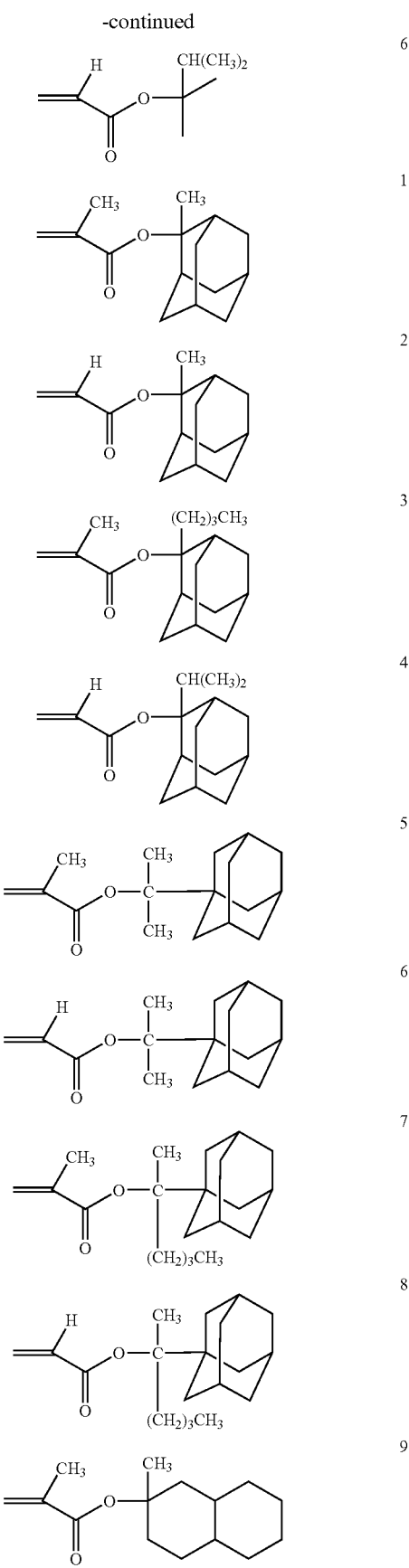
Specific examples of monomers corresponding to the repeating unit represented by formula (A2) are set forth below, but the present invention is not limited thereto.
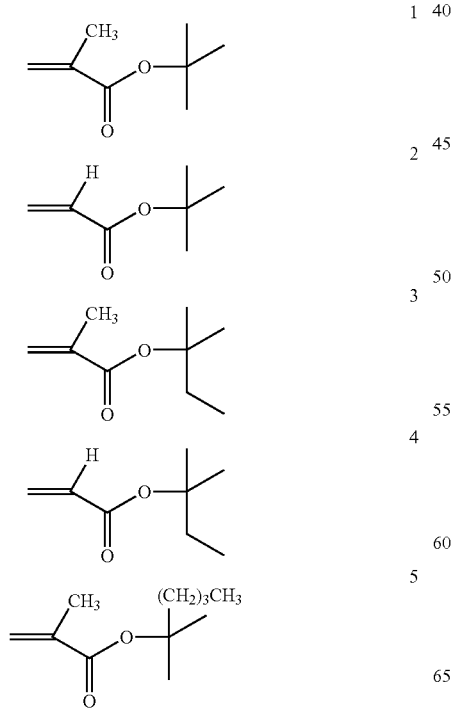

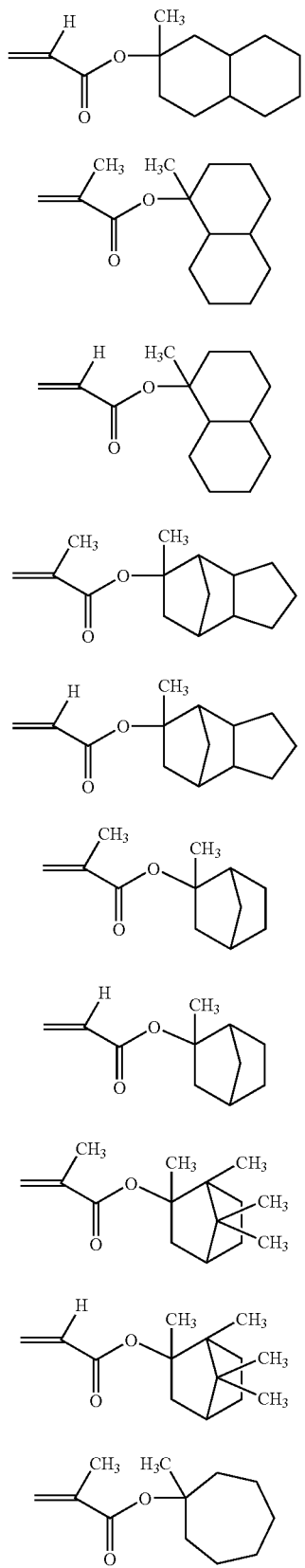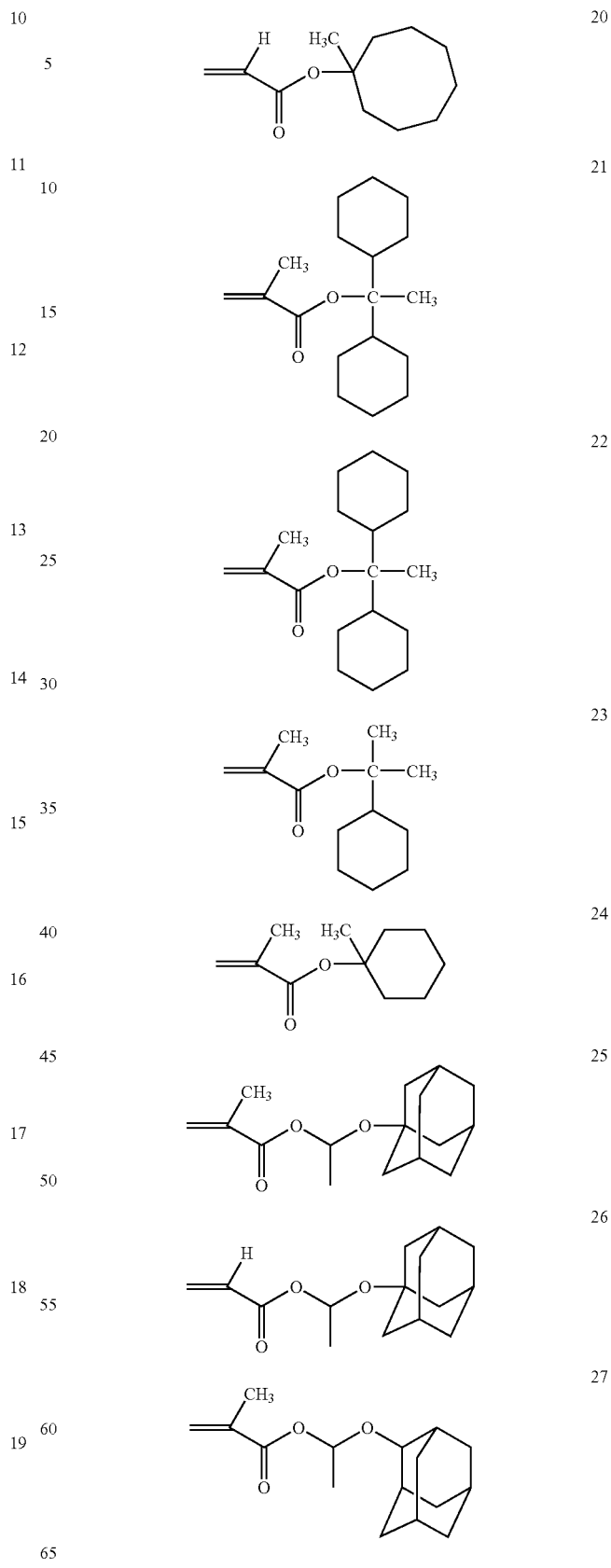

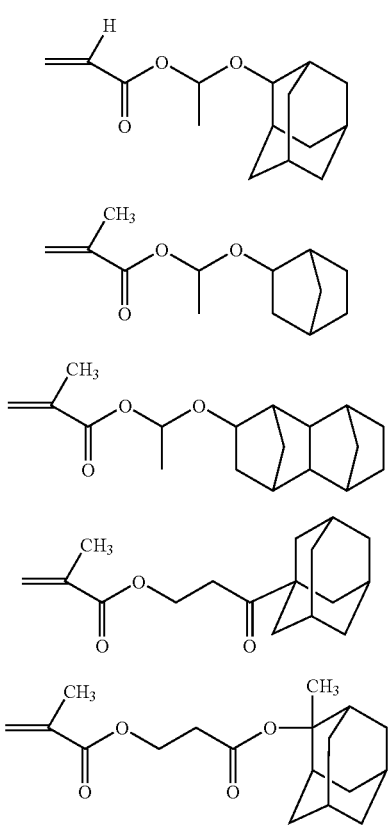

The resin (A) preferably further contains a repeating unit represented by formula (A4).

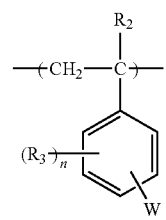

In formula (A4), $R_2$ represents a hydrogen atom, a methyl group, a cyano group, a halogen atom or a perfluoro group having a carbon number of 1 to 4.

$R_3$ represents a hydrogen atom, an alkyl group, a halogen atom, an aryl group, an alkoxy group or an acyl group.

n represents an integer of 0 to 4.

W represents a group incapable of decomposing under the action of an acid.

W represents a group incapable of decomposing under the action of an acid (sometimes referred to as an "acid-stable group"), and specific examples thereof include a hydrogen atom, a halogen atom, an alkyl group, a cycloalkyl group, an alkenyl group, an aryl group, an acyl group, an alkylamido group, an arylamidomethyl group and an arylamido group. The acid-stable group is preferably an acyl group or an alkylamido group, more preferably an acyl group, an alkylcarbonyloxy group, an alkyloxy group, a cycloalkyloxy group or an aryloxy group.

In the acid-stable group represented by W, the alkyl group is preferably an alkyl group having a carbon number of 1 to 4, such as methyl group, ethyl group, propyl group, n-butyl group, sec-butyl group and tert-butyl group; the cycloalkyl group is preferably a cycloalkyl group having a carbon number of 3 to 10, such as cyclopropyl group, cyclobutyl group, cyclohexyl group and adamantyl group; the alkenyl group is preferably an alkenyl group having a carbon number of 2 to 4, such as vinyl group, propenyl group, allyl group and butenyl group; the alkenyl group is preferably an alkenyl group having a carbon number of 2 to 4, such as vinyl group, propenyl group, allyl group and butenyl group; and the aryl group is preferably an aryl group having a carbon number of 6 to 14, such as phenyl group, xylyl group, toluyl group, cumenyl group, naphthyl group and anthracenyl group. W may be present at any position on the benzene ring but is preferably present at the meta-position or para-position, more preferably at the para-position, of the styrene skeleton.

Specific examples of the repeating unit represented by formula (A4) are set forth below, but the present invention is not limited thereto.

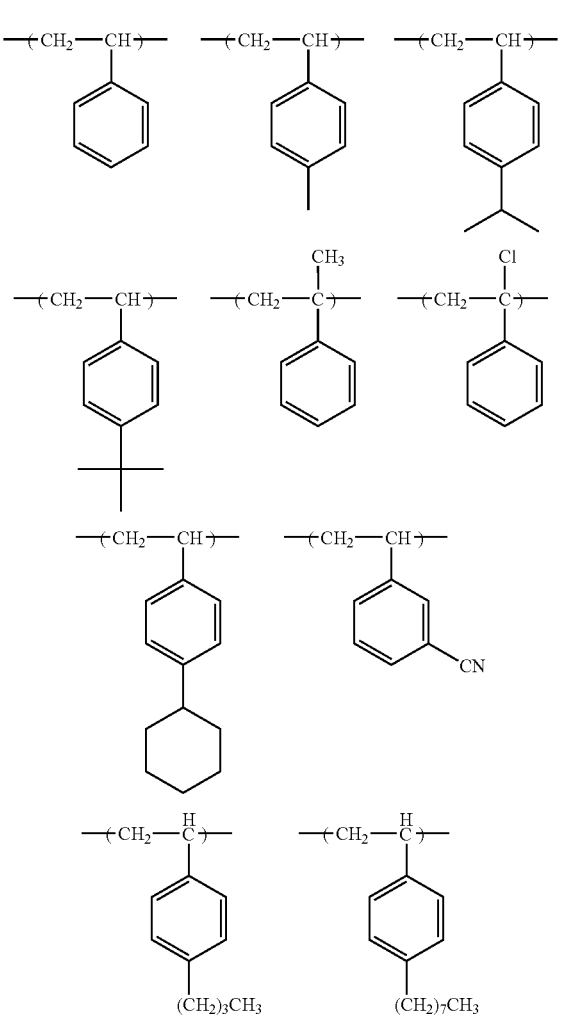

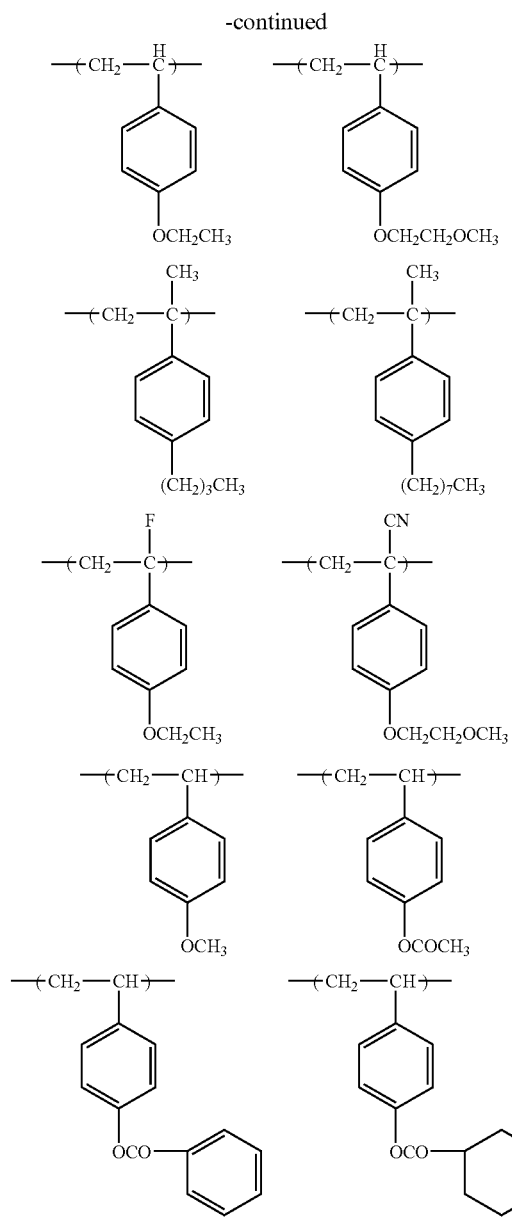

The resin (A) preferably further contains a repeating unit comprising a (meth)acrylic acid derivative incapable of decomposing under the action of an acid. Specific examples thereof are set forth below, but the present invention is not limited thereto.

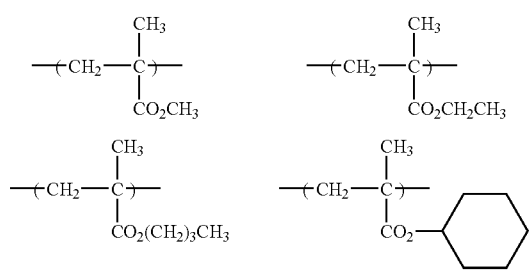

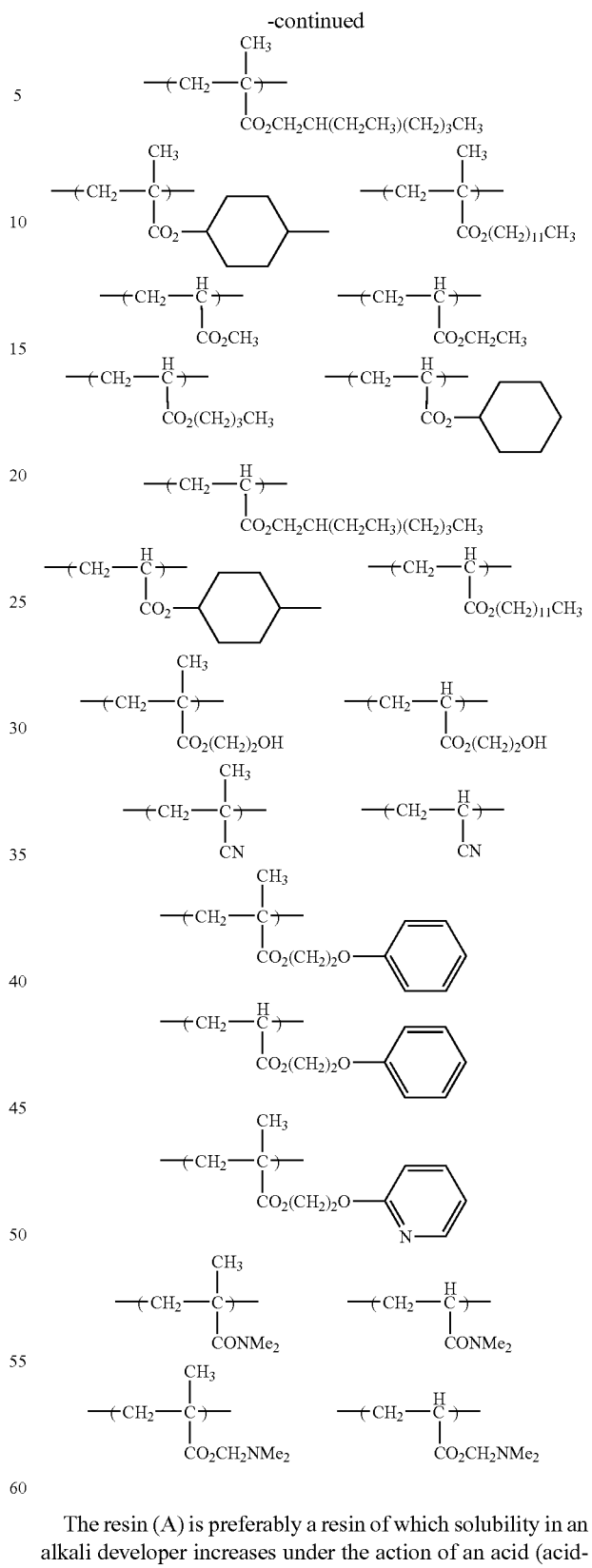

The resin (A) is preferably a resin of which solubility in an alkali developer increases under the action of an acid (acid-decomposable resin), and preferably contains a group capable of decomposing under the action of an acid to produce an alkali-soluble group (acid-decomposable group), in an arbitrary repeating unit.

As described above, the acid-decomposable group may be contained in the repeating unit represented by formula (I), (A1) or (A2) or in other repeating units.

Examples of the acid-decomposable group include, in addition to those described above, a group represented by —C(=O)—X$_1$—R$_0$.

In the formula above, R$_0$ represents, for example, a tertiary alkyl group such as tert-butyl group and tert-amyl group, a 1-alkoxyethyl group such as isobornyl group, 1-ethoxyethyl group, 1-butoxyethyl group, 1-isobutoxyethyl group and 1-cyclohexyloxyethyl group, an alkoxymethyl group such as 1-methoxymethyl group and 1-ethoxymethyl group, a 3-oxoalkyl group, a tetrahydropyranyl group, a tetrahydrofuranyl group, a trialkylsilyl ester group, a 3-oxocyclohexyl ester group, a 2-methyl-2-adamantyl group or a mevalonic lactone group. X$_1$ represents an oxygen atom, a sulfur atom, —NH—, —NHSO$_2$— or —NHSO$_2$NH—.

The content of the repeating unit represented by formula (I) in the resin (A) is preferably from 10 to 60 mol %, more preferably from 15 to 50 mol %, still more preferably from 20 to 40 mol %, based on all repeating units.

The content of the repeating unit represented by formula (A1) in the resin (A) is preferably from 40 to 90 mol %, more preferably from 50 to 85 mol %, still more preferably from 60 to 80 mol %, based on all repeating units.

The content of the repeating unit represented by formula (A2) in the resin (A) is preferably from 5 to 60 mol %, more preferably from 10 to 50 mol %, still more preferably from 15 to 35 mol %, based on all repeating units.

The content of the group capable of decomposing under the action of an acid is preferably from 0.01 to 0.7, more preferably from 0.05 to 0.50, still more preferably from 0.05 to 0.40. Here, the content of the group capable of decomposing under the action of an acid is defined by B/(B+S) using the number (B) of groups capable of decomposing under the action of an acid and the number (S) of alkali-soluble groups not protected by a group capable of desorbing under the action of an acid, in the resin.

In the resin (A), an appropriate other polymerizable monomer may be copolymerized to introduce an alkali-soluble group such as phenolic hydroxyl group and carboxyl group and thereby maintain good developability with an alkali developer, or a hydrophobic other polymerizable monomer such as alkyl acrylate and alkyl methacrylate may be copolymerized so as to enhance the film quality.

The resin (A) for use in the present invention may contain a repeating unit having a lactone group, preferably a repeating unit containing a group having a lactone structure represented by the following formula (Lc) or by any one of the following formulae (V-1) to (V-5), and the group having a lactone structure may be bonded directly to the main chain.

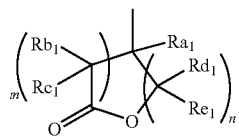
(Lc)

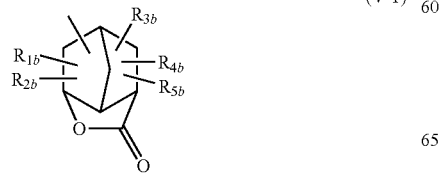
(V-1)

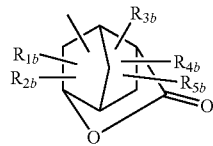
(V-2)

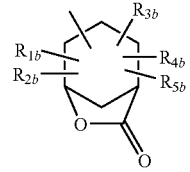
(V-3)

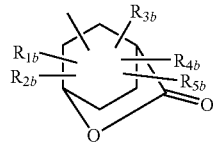
(V-4)

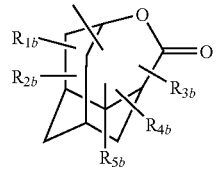
(V-5)

In formula (Lc), Ra$_1$, Rb$_1$, Rc$_1$, Rd$_1$ and Re$_1$ each independently represents a hydrogen atom or an alkyl group which may have a substituent, m and n each independently represents an integer of 0 to 3, and m+n is from 2 to 6.

In formulae (V-1) to (V-5), R$_{1b}$ to R$_{5b}$ each independently represents a hydrogen atom or an alkyl, cycloalkyl, alkoxy, alkoxycarbonyl, alkylsulfonylimino or alkenyl group which may have a substituent, and two members out of R$_{1b}$ to R$_{5b}$ may combine to form a ring.

The alkyl group of Ra$_1$ to Re$_1$ in formula (Lc) and the alkyl group in the alkyl group, alkoxy group, alkoxycarbonyl group and alkylsulfonylimino group of R$_{1b}$ to R$_{5b}$ in formulae (V-1) to (V-5) include a linear or branched alkyl group and may have a substituent.

Examples of the repeating unit containing a group having a lactone structure represented by formula (Lc) or by any one of formulae (V-1) to (V-5) include a repeating unit where at least one of R$_{13}$' to R$_{16}$' in formula (II-A) or (II-B) has a group represented by formula (Lc) or by any one of formulae (V-1) to (V-5) (for example, R$_5$ in —COOR$_5$ is a group represented by formula (Lc) or by any one of formulae (V-1) to (V-5)), and a repeating unit represented by the following formula (AI):

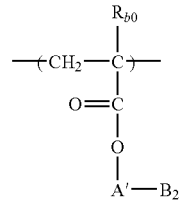
(AI)

In formula (AI), R$_{b0}$ represents a hydrogen atom, a halogen atom or a substituted or unsubstituted alkyl group having a carbon number of 1 to 4. Preferred examples of the substituent which the alkyl group of $R_{b0}$ may have include those described above as preferred examples of the substituent which the alkyl group of $R_{1b}$ in formulae (V-1) to (V-5) may have.

Examples of the halogen atom of $R_{b0}$ include a fluorine atom, a chlorine atom, a bromine atom and an iodine atom. $R_{b0}$ is preferably a hydrogen atom.

A' represents a single bond, an ether group, an ester group, a carbonyl group, an alkylene group or a divalent group comprising a combination thereof.

$B_2$ represents a group represented by formula (Lc) or by any one of formulae (V-1) to (V-5).

Specific examples of the repeating unit containing a group having a lactone structure are set forth below, but the present invention is not limited thereto.

(In the formulae, Rx is H, $CH_3$ or $CF_3$.)

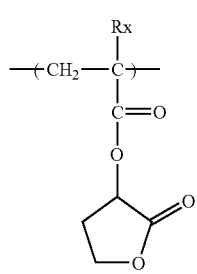 (IV-1)

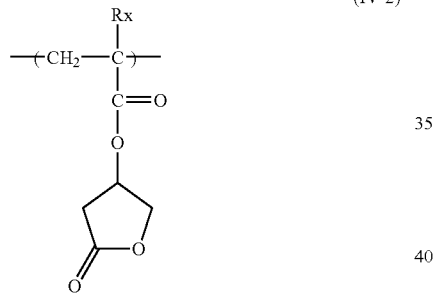 (IV-2)

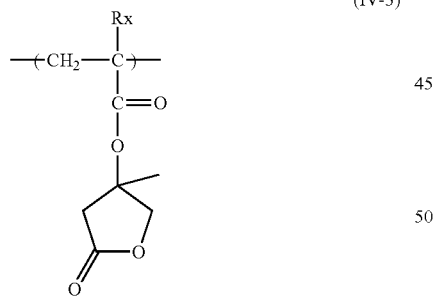 (IV-3)

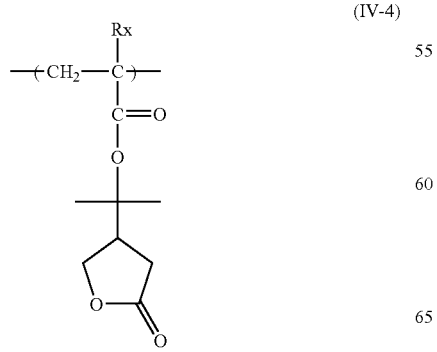 (IV-4)

-continued

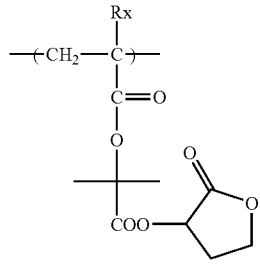 (IV-5)

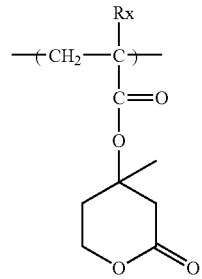 (IV-6)

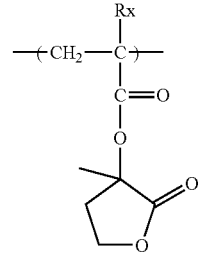 (IV-7)

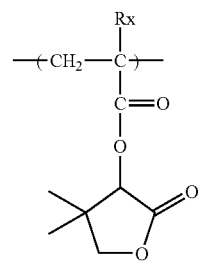 (IV-8)

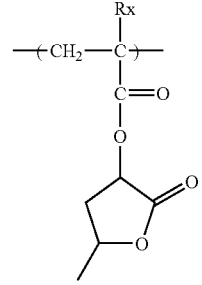 (IV-9)

(IV-10) 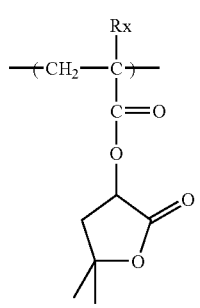
(IV-11) 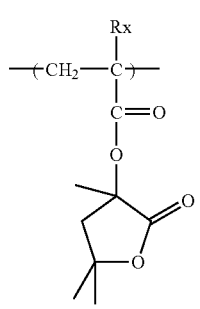
(IV-12) 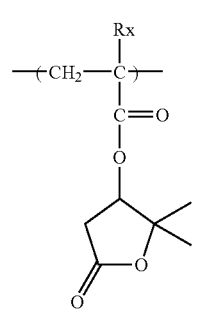
(IV-13) 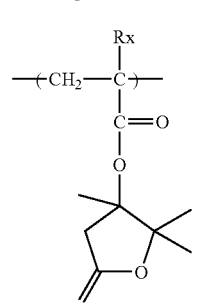
(IV-14) 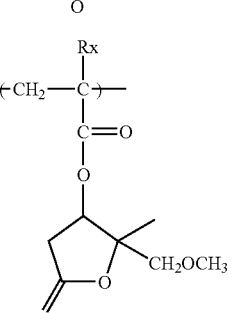
(IV-15) 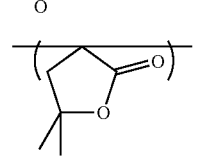
(IV-16) 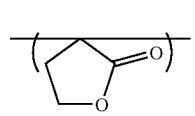
(In the formulae, Rx is H, CH$_3$ or CF$_3$.)
(Ib-1) 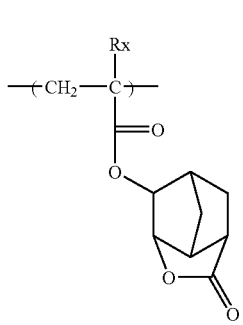
(Ib-2) 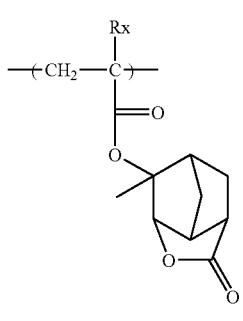
(Ib-3) 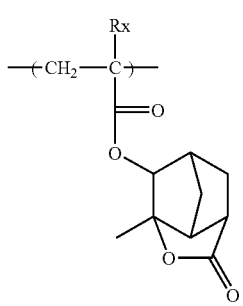
(Ib-4) 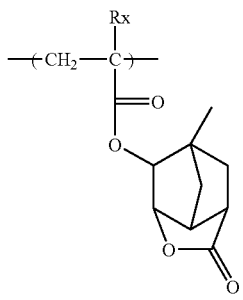

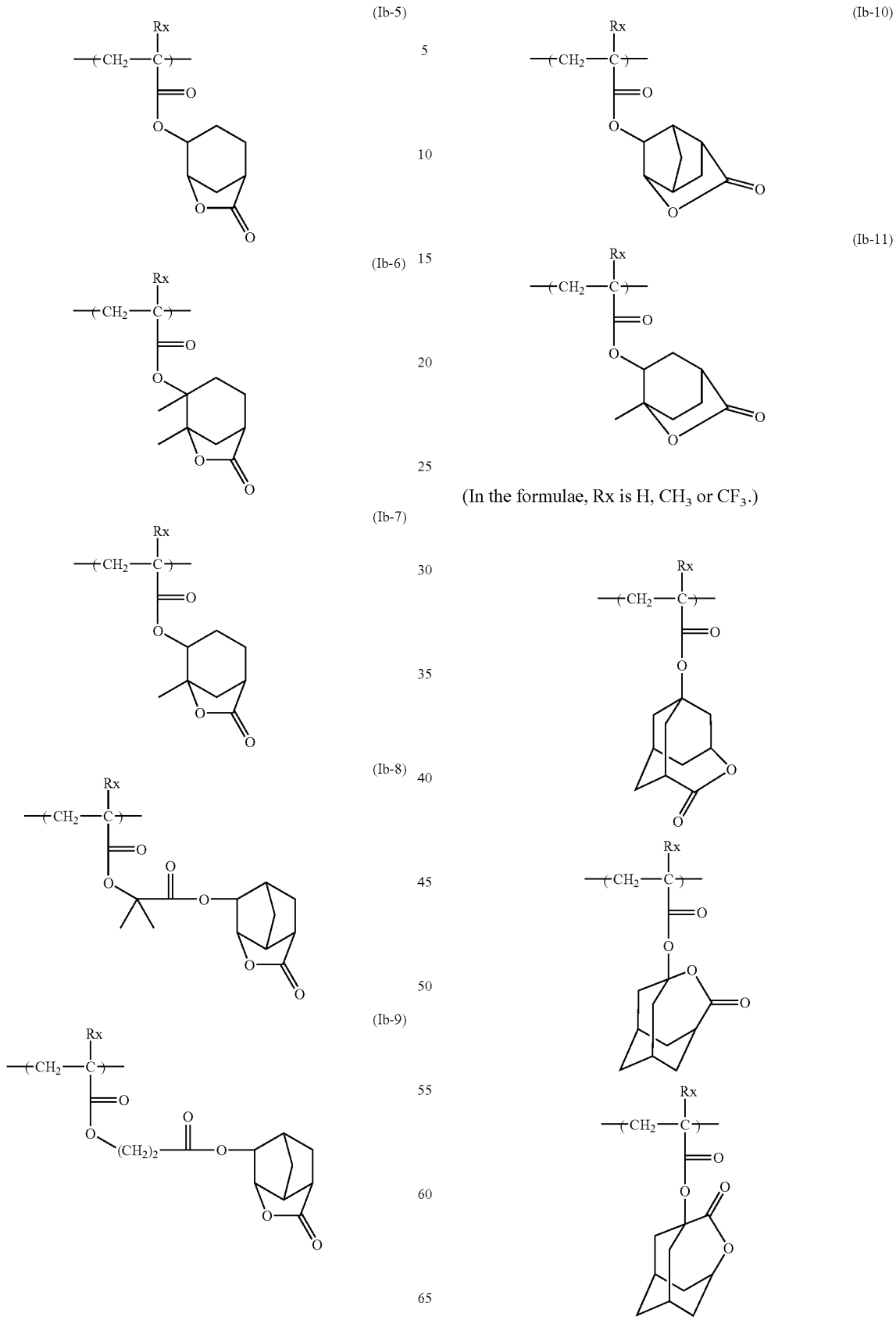
(In the formulae, Rx is H, CH₃ or CF₃.)

-continued
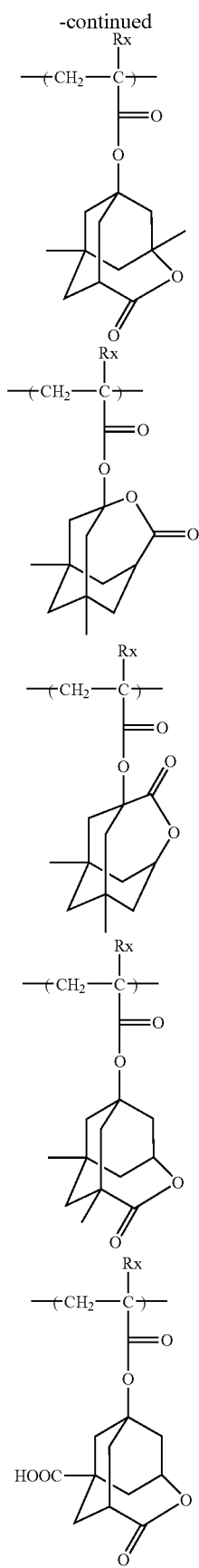
-continued
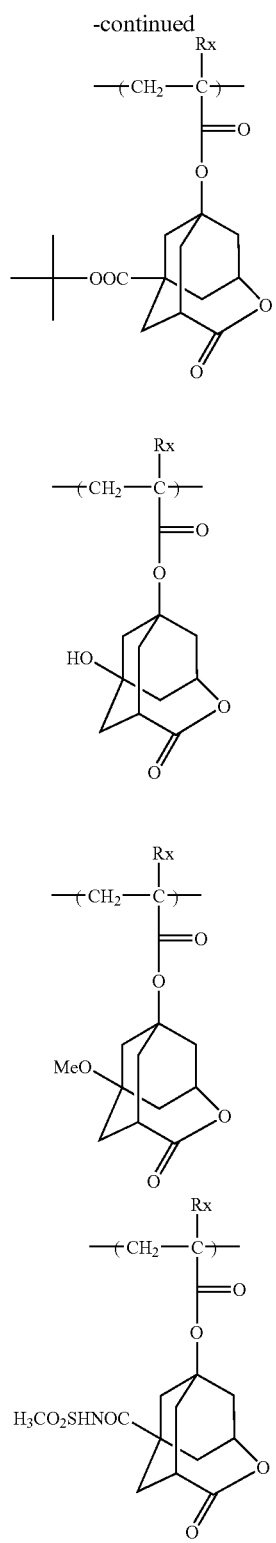
The resin (A) of the present invention preferably contains a repeating unit having an alicyclic group substituted with a hydroxyl group. As the repeating unit having an alicyclic group substituted with a hydroxyl group, for example, a repeating unit having a group represented by the following formula (VII) is exemplified.

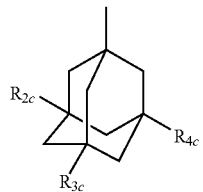

(VII)

In formula (VII), $R_{2c}$ to $R_{4c}$ each independently represents a hydrogen atom or a hydroxyl group, provided that at least one of $R_{2c}$ to $R_{4c}$ represents a hydroxyl group.

The group represented by formula (VII) is preferably a dihydroxy form or a monohydroxy form, more preferably a dihydroxy form.

Examples of the repeating unit having a group represented by formula (VII) include a repeating unit where at least one of $R_{13}'$ to $R_{16}'$ in formula (II-A) or (II-B) has a group represented by formula (VII) (for example, $R_5$ in —$COOR_5$ is a group represented by formula (VII)), and a repeating unit represented by the following formula (AII):

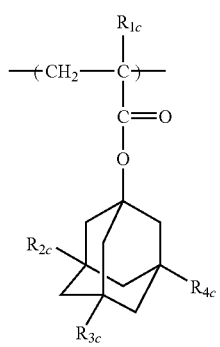

(AII)

In formula (AII), $R_{1c}$ represents a hydrogen atom or a methyl group.

$R_{2c}$ to $R_{4c}$ each independently represents a hydrogen atom or a hydroxyl group, provided that at least one of $R_{2c}$ to $R_{4c}$ represents a hydroxyl group. A repeating unit where two members out of $R_{2c}$ to $R_{4c}$ are a hydroxyl group is preferred.

Specific examples of the repeating unit having the structure represented by formula (AII) are set forth below, but the present invention is not limited thereto.

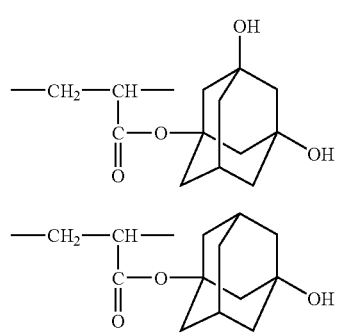

(1)

(2)

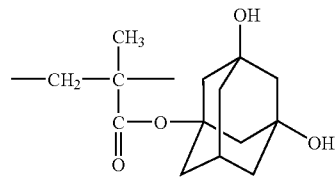

(3)

(4)

The resin (A) may be partially crosslinked by a crosslinking group capable of decomposing under an action of an acid. By the crosslinking, defocus latitude depended on line pitch can further be improved.

The crosslinking group capable of decomposing under an action of an acid is a kind of a group which is capable of converting linear polymers connected with each other by crosslinkage where the crosslinking group capable of decomposing under an action of an acid is present into linear polymers by breakage of the crosslinkage due to the decomposition of the group.

The crosslinkage is present in preferably 0.5 to 10%, more preferably 1 to 5% with respect to the number of the repeating units constituting the resin.

The weight average molecular weight (Mw) of the resin (A) is preferably from 1,000 to 15,000, more preferably from 3,000 to 10,000. The dispersity (Mw/Mn) is preferably from 1.0 to 2.0, more preferably from 1.0 to 1.8, still more preferably from 1.0 to 1.5.

The weight average molecular weight here is defined as a polystyrene-reduced value determined by gel permeation chromatography.

The dispersity can be adjusted by selecting the polymerization method or the purification method of the resin. The resin (A) having a dispersity of 1.5 to 2.0 can be synthesized, for example, by radical polymerization using an azo-based polymerization initiator. Also, the resin (A) having a still more preferred dispersity of 1.0 to 1.5 can be synthesized, for example, by living radical polymerization.

Two or more species of the resin (A) may be used in combination.

The amount of the resin (A) added is, as the total amount, usually from 10 to 96 mass %, preferably from 15 to 96 mass %, more preferably from 20 to 95 mass %, based on the entire solid content of the positive resist composition. (In this specification, mass ratio is equal to weight ratio.)

Specific examples of the (A) resin containing a repeating unit represented by formula (I) are set forth below, but the present invention is not limited thereto.

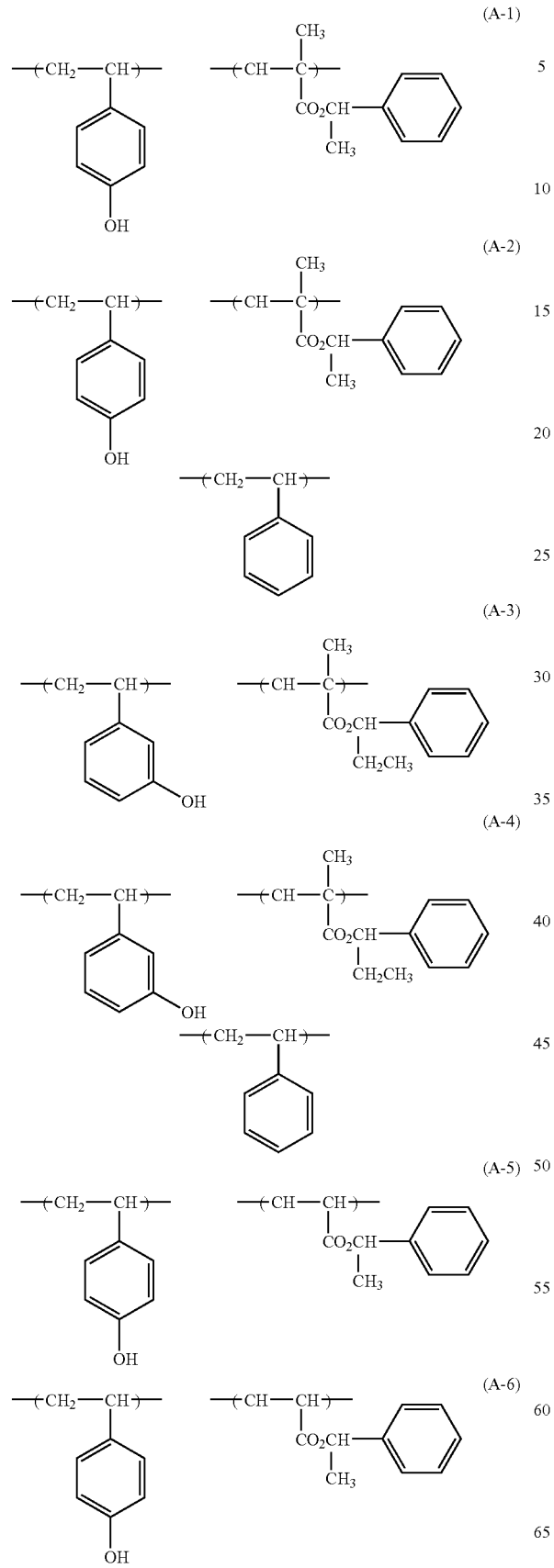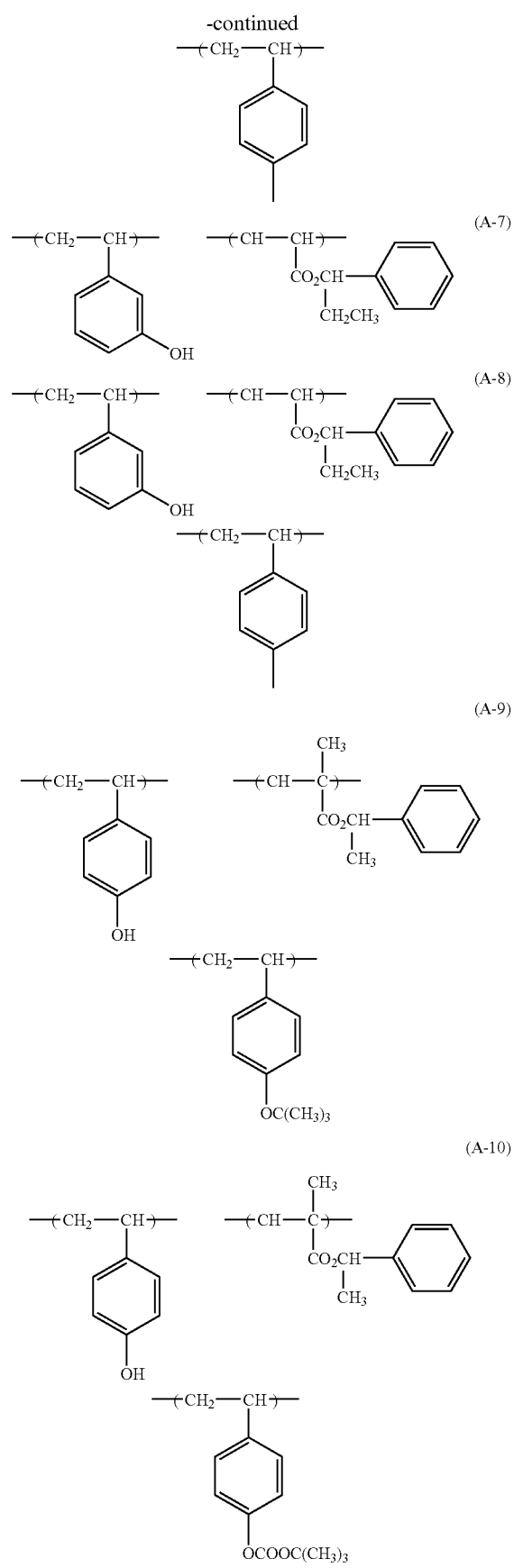

(A-11)
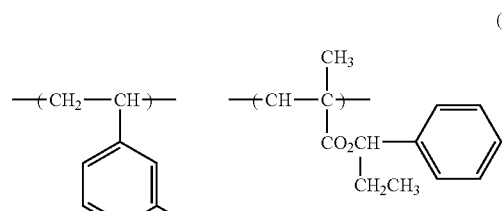
(A-12)
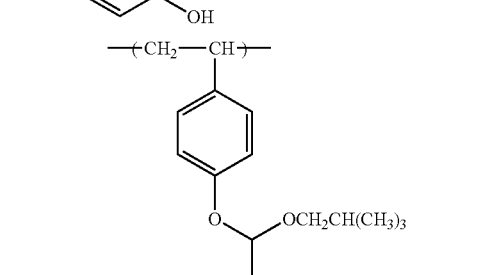
(A-13)
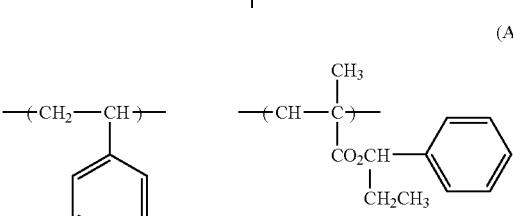
(A-14)
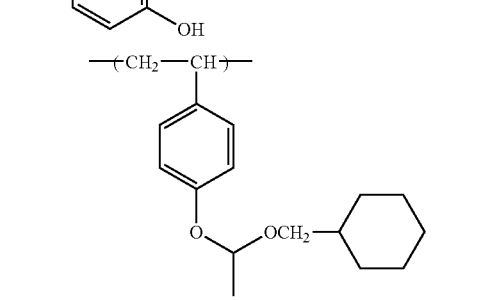
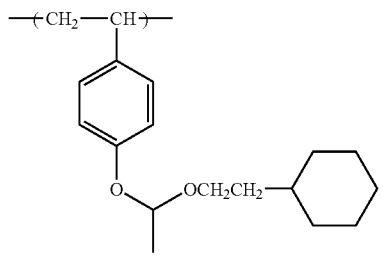
(A-15)
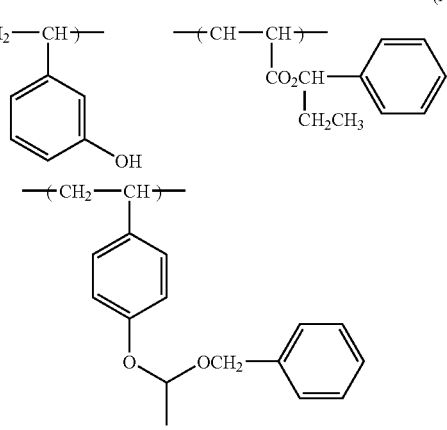
(A-16)
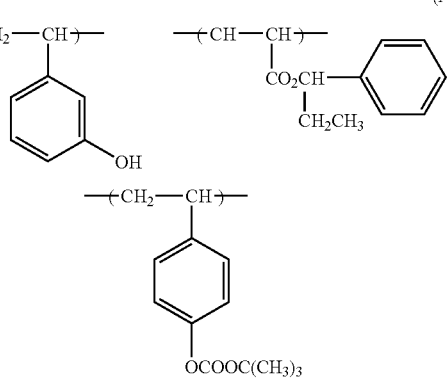
(A-17)
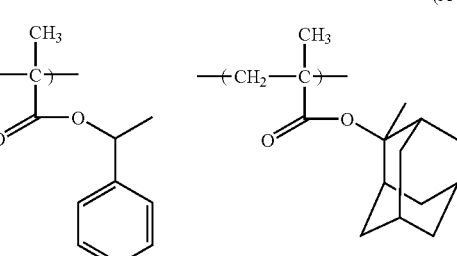
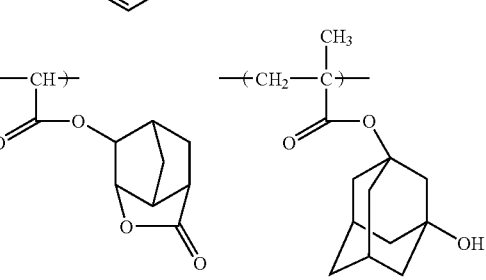

-continued
(A-18)
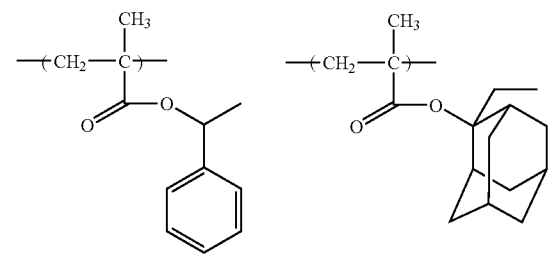
(A-19)
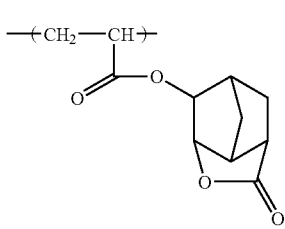
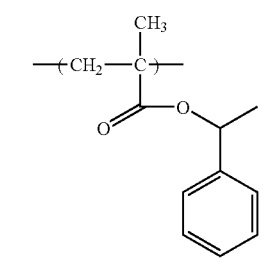
(A-20)
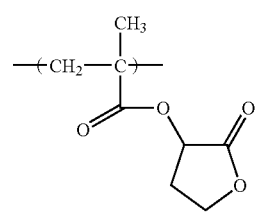
(A-21)
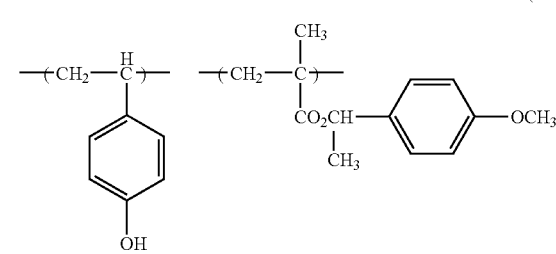
-continued
(A-22)
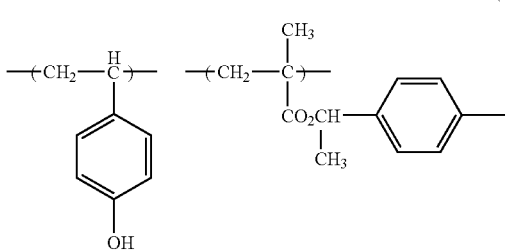
(A-23)
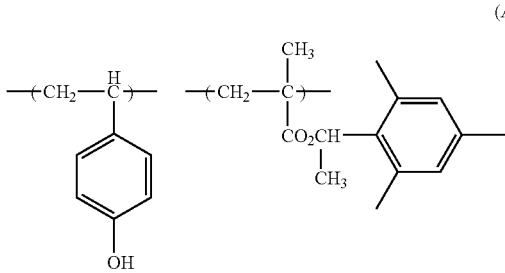
(A-24)
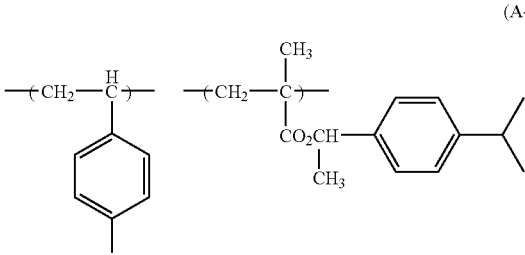
(A-25)
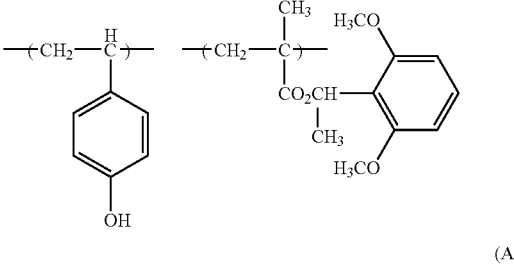
(A-26)
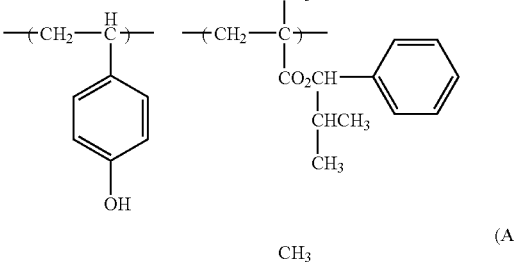
(A-27)
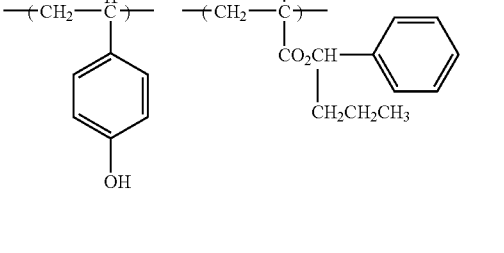

(A-28)
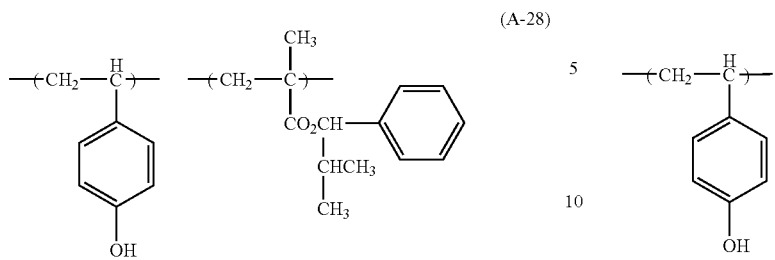
(A-29)
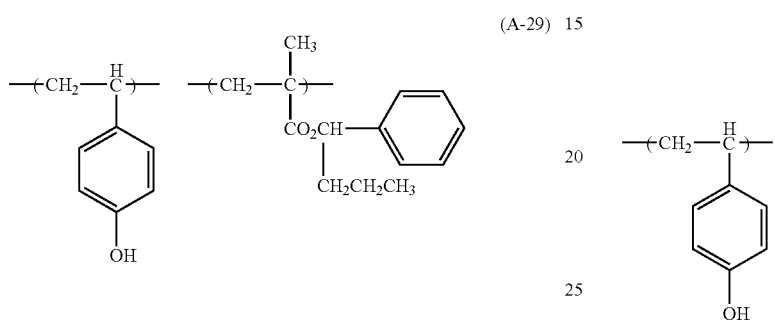
(A-30)
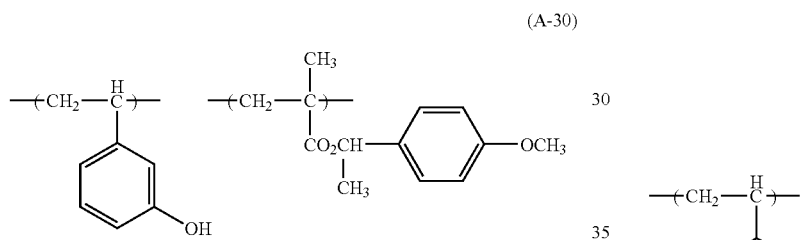
(A-31)
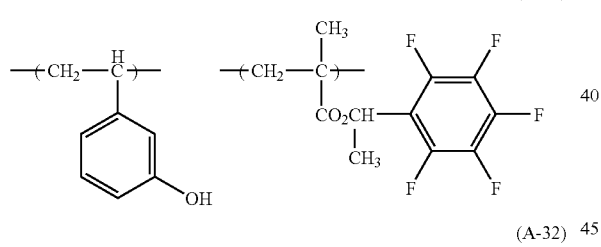
(A-32)
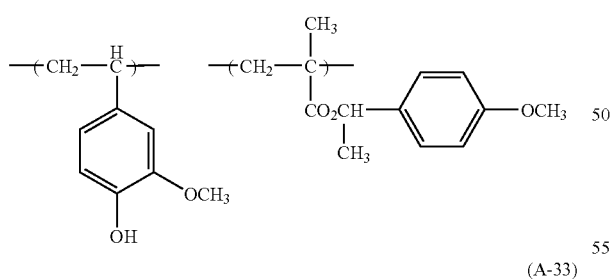
(A-33)
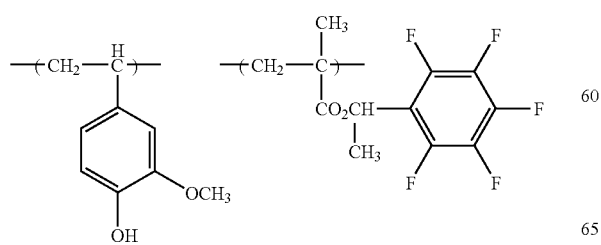
(A-34)
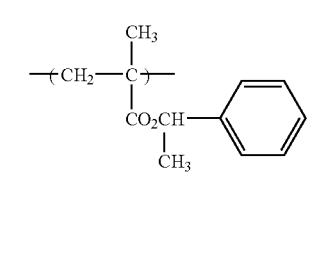
(A-35)
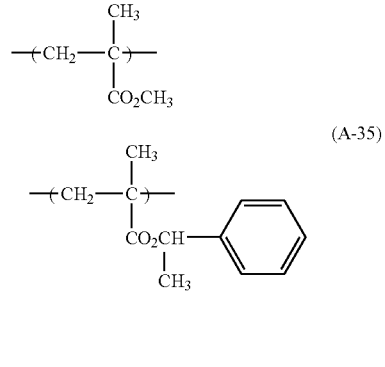
(A-36)
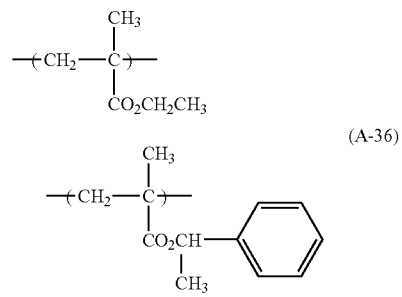
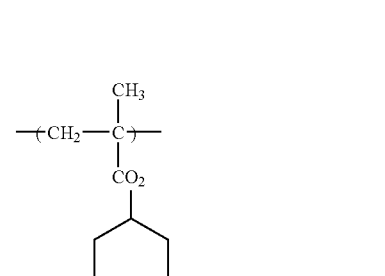
(A-37)
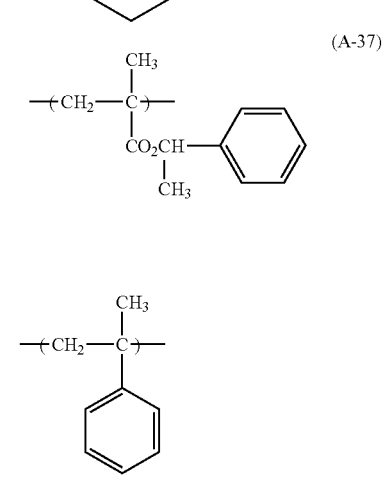

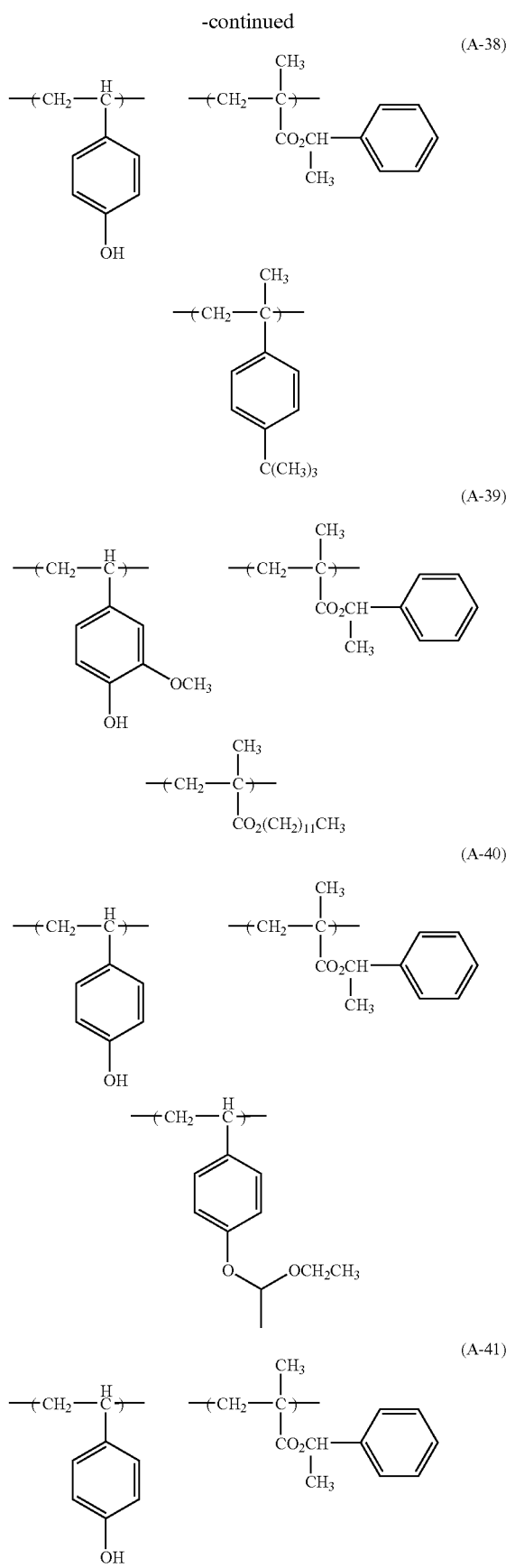
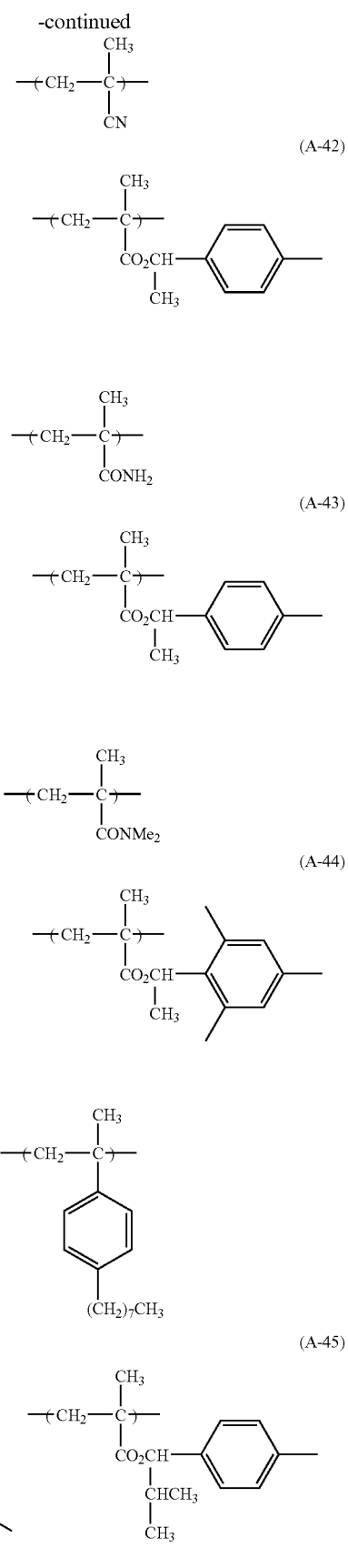

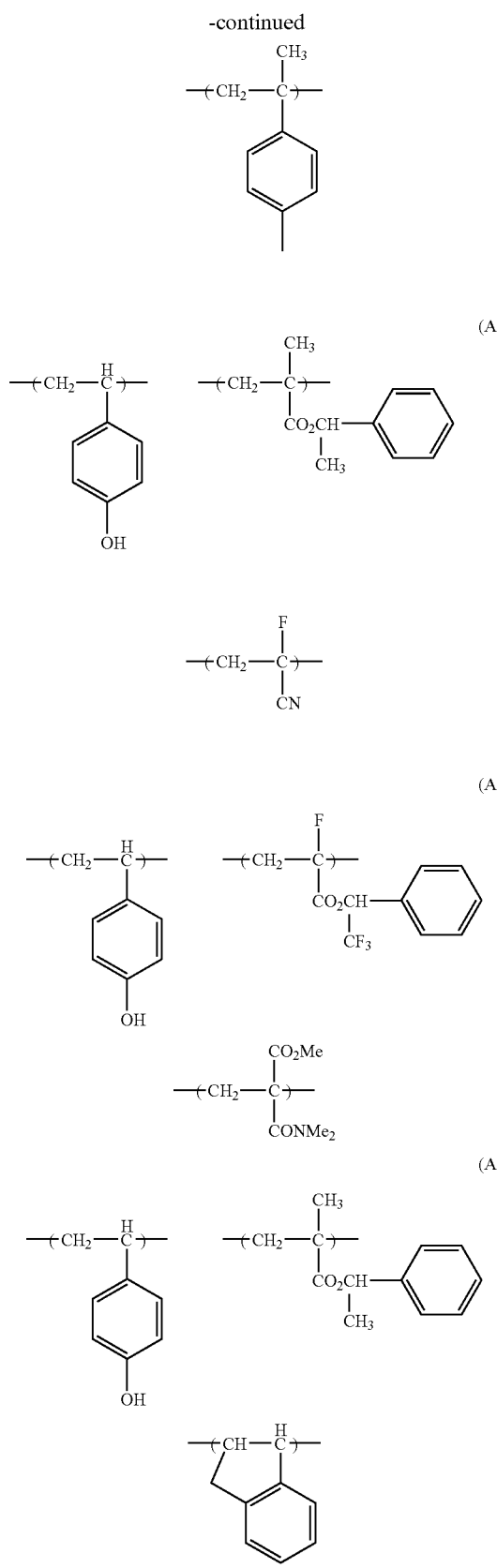

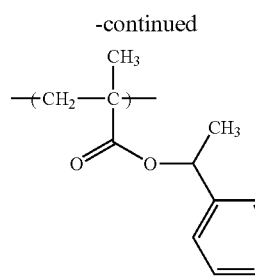

In the case of irradiating KrF excimer laser light, electron beam, X ray or high-energy beam at a wavelength of 50 nm or less (e.g., EUV), the positive photosensitive composition of the present invention preferably contains a hydroxystyrene copolymer protected by hydroxystyrene/acid-decomposable group, or a hydroxystyrene/tertiary alkyl (meth)acrylate copolymer.

Specific examples thereof are set forth below, but the present invention is not limited thereto. Incidentally, tBu indicates a tert-butyl group.

(R-1)
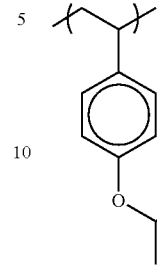

(R-2)
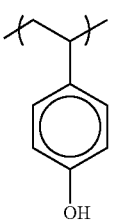

(R-3)
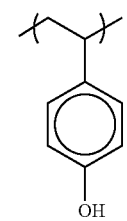

(R-4)
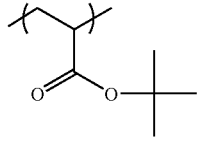

(R-5)
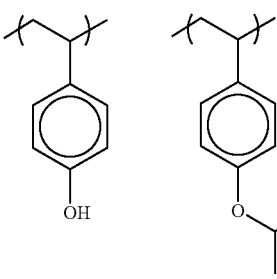

(R-6)
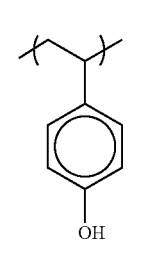

(R-7)
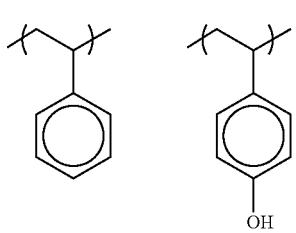

(R-8)
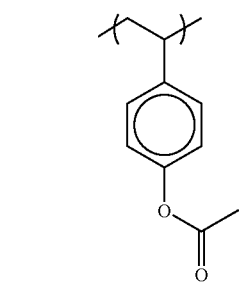

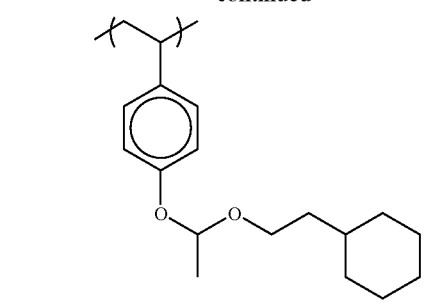
(R-9)
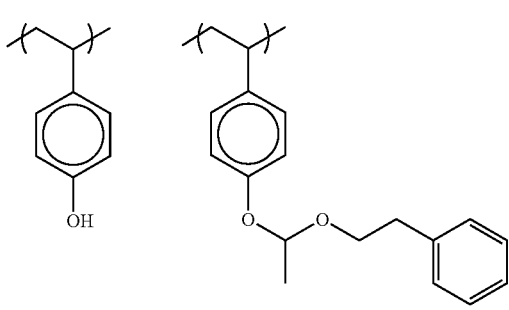
(R-10)
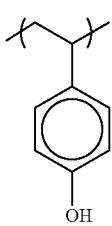
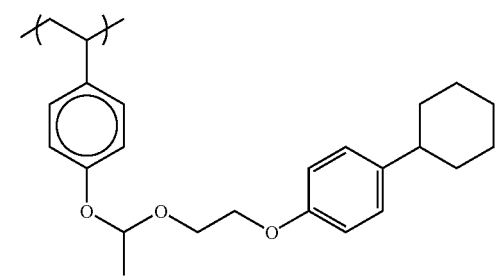
(R-11)
(R-12)
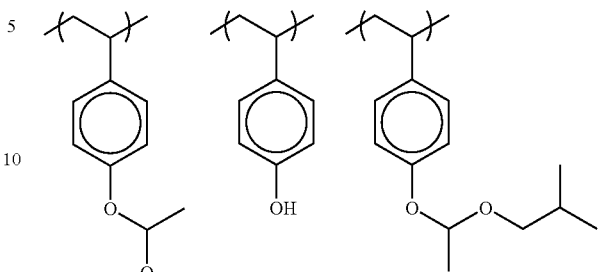
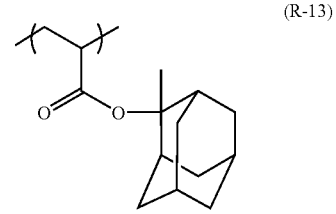
(R-13)
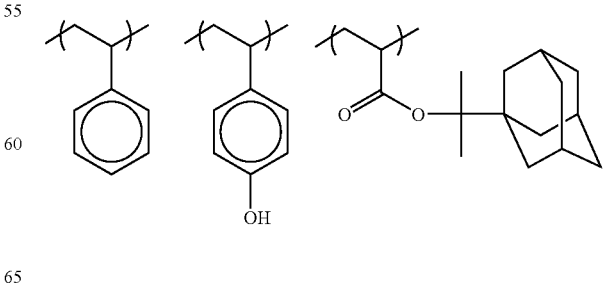
(R-14)

-continued

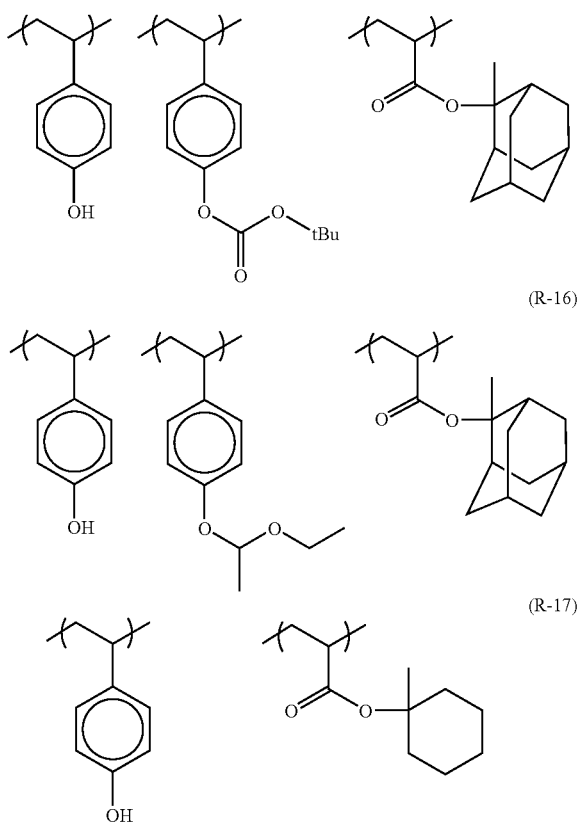

[2] Compound Capable of Generating Acid Upon Irradiation with Actinic Rays or Radiation In the resist composition of the present invention, a known compound may be used as the compound capable of generating an acid upon irradiation with actinic rays or radiation (acid generator), but a compound capable of generating a sulfonic acid upon irradiation with actinic rays or radiation (sulfonic acid generator) and/or a compound capable of generating a carboxylic acid upon irradiation with actinic rays or radiation (carboxylic acid generator) are preferably contained.

<Compound (B) Capable of Generating Sulfonic Acid Upon Irradiation with Actinic Rays or Radiation>

The compound capable of generating a sulfonic acid upon irradiation with actinic rays or radiation (sometimes referred to as a "compound (B)" or a "sulfonic acid generator") is a compound capable of generating a sulfonic acid upon irradiation with actinic rays or radiation such as KrF excimer laser, electron beam and EUV, and examples thereof include a diazonium salt, a phosphonium salt, a sulfonium salt, an iodonium salt, an imidosulfonate, an oxime sulfonate, a diazodisulfone, a disulfone and an o-nitrobenzylsulfonate.

Also, a compound where such a group or compound capable of generating an acid upon irradiation with actinic rays or radiation is introduced into the main or side chain of a polymer may be used, and examples thereof include the compounds described in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029.

Furthermore, compounds capable of generating an acid by the effect of light described, for example, in U.S. Pat. No. 3,779,778 and European Patent 126,712 may also be used.

In the present invention, from the standpoint of enhancing the image performance such as resolving power and pattern profile, a sulfonium salt, an iodonium salt, an imidosulfonate, an oxime sulfonate, a diazodisulfone and a disulfone are preferred, and an oxime sulfonate and a diazodisulfone are more preferred as the sulfonic acid generator.

Particularly preferred examples of these compounds set forth below.

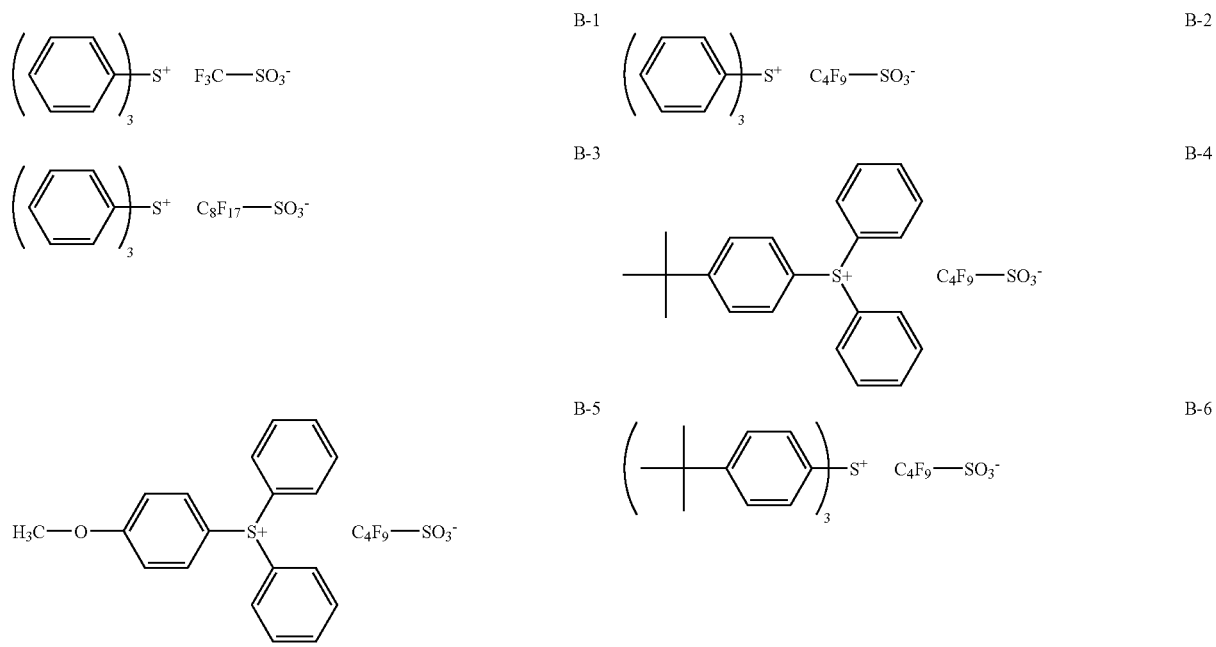

-continued
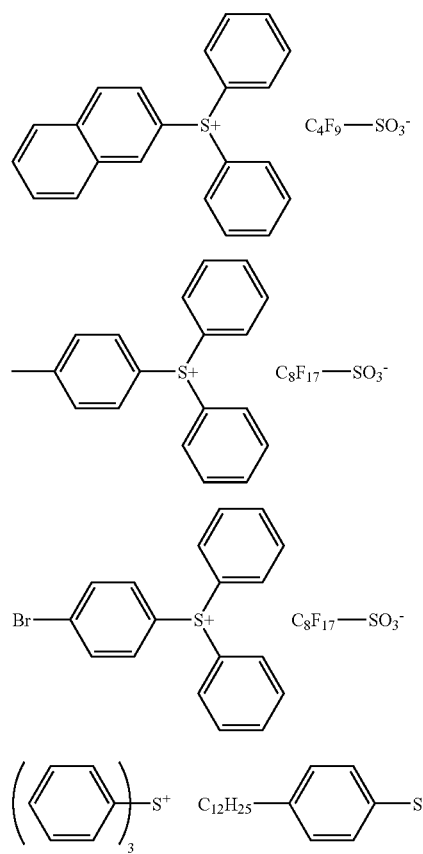
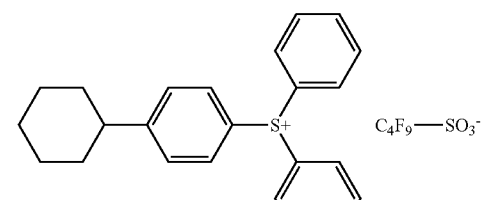
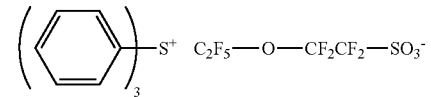
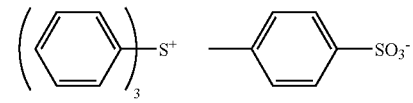
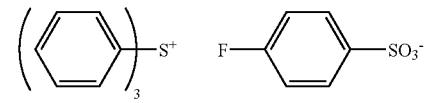
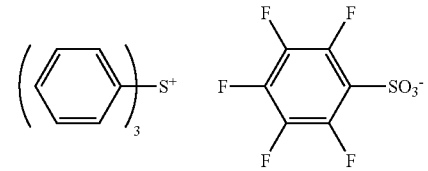
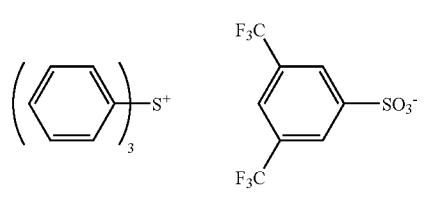
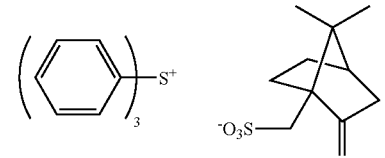
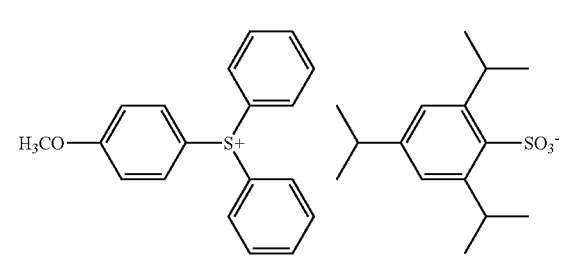
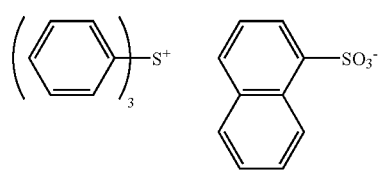

B-22
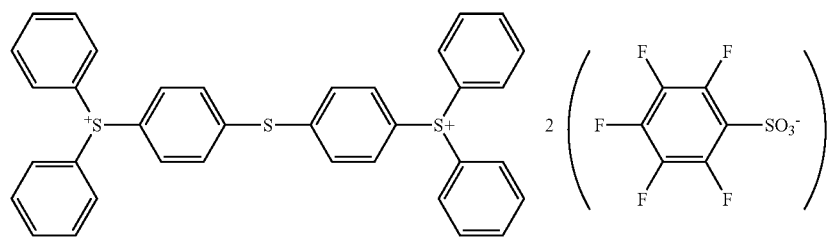
B-23
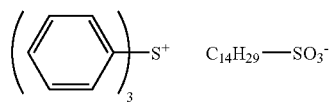
B-24
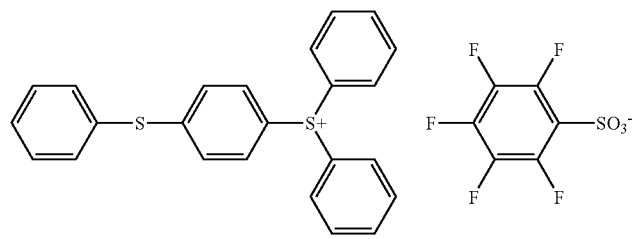
B-25  B-26
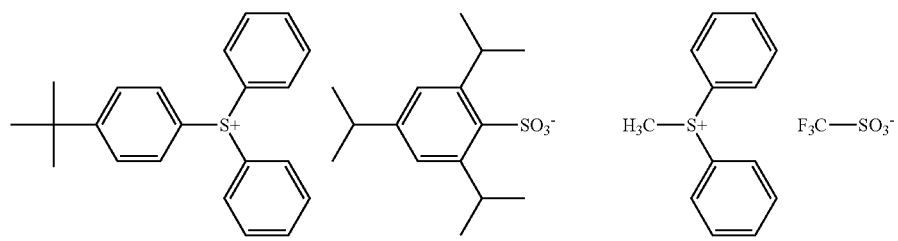
B-27
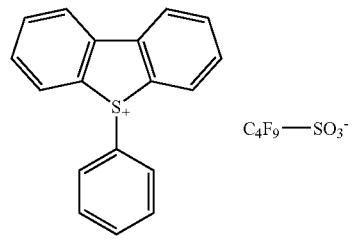
B-28
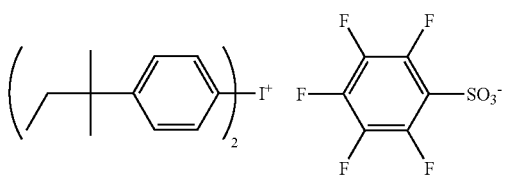
B-29
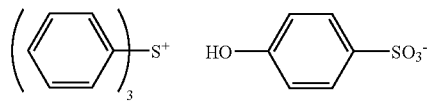
B-30
B-31
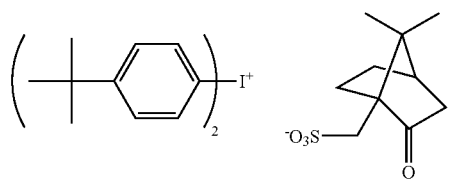
B-32

-continued
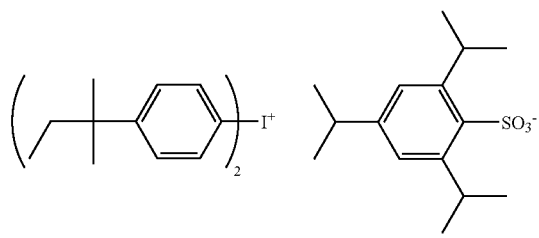 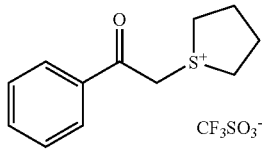
B-33
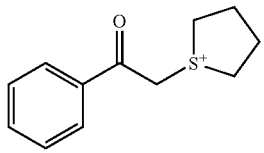
B-34
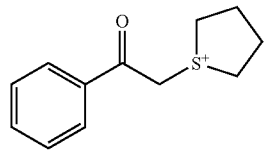
B-35
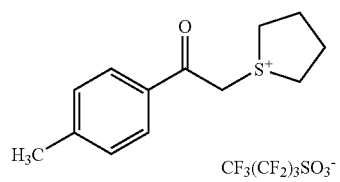
B-37
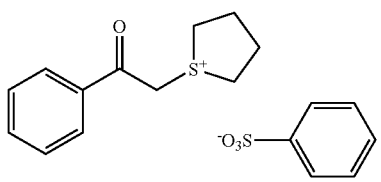
B-36
B-38
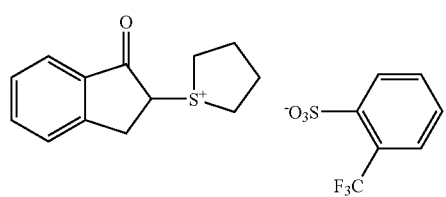
B-39
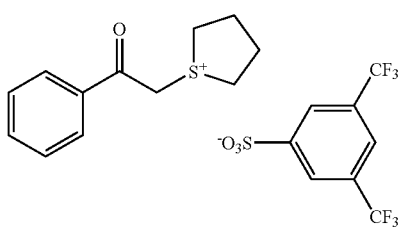
B-40
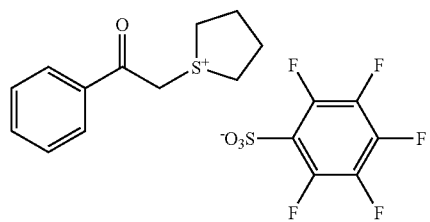
B-41
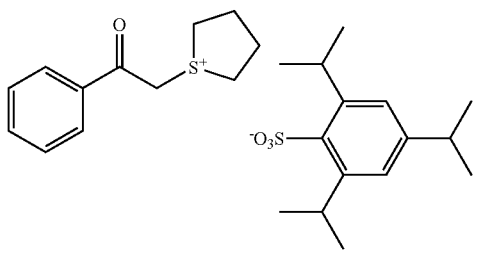
B-42
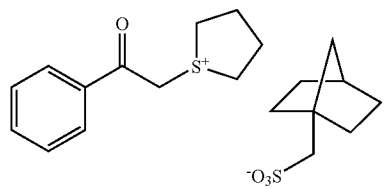
B-43
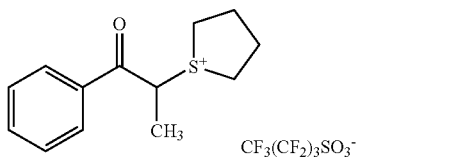
B-44
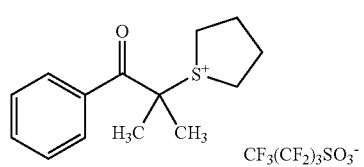
B-45
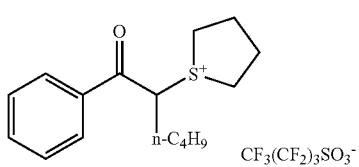
B-46
B-47
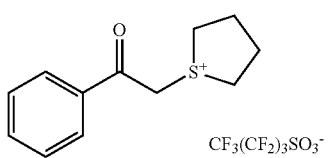
B-48

-continued
B-49
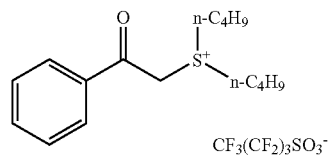
B-50
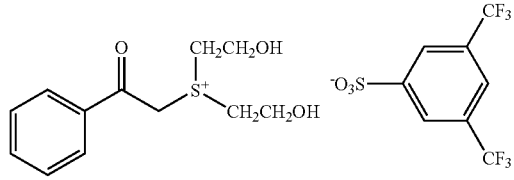
B-51
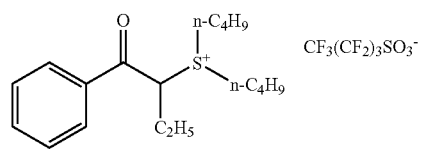
B-52
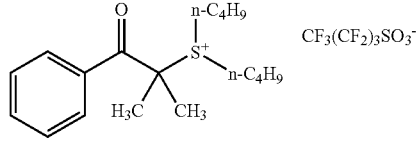
B-53
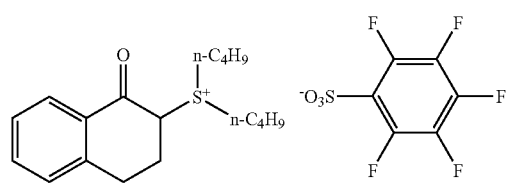
B-54
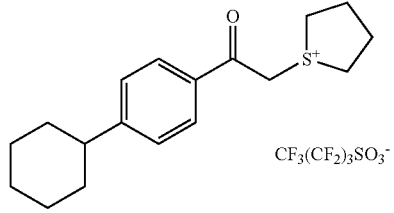
B-55
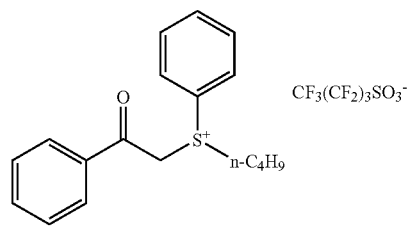
B-56
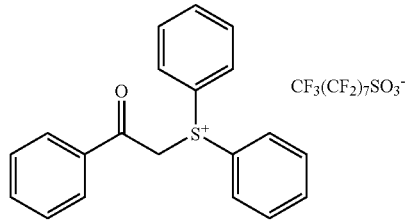
B-57
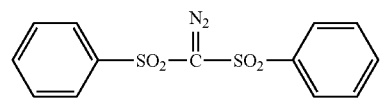
B-58
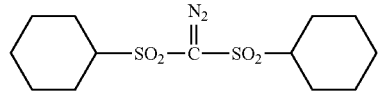
B-59
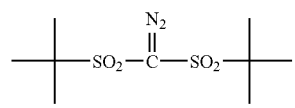
B-60
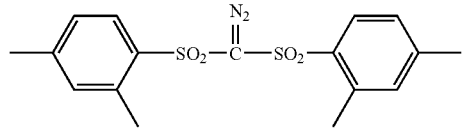
B-61
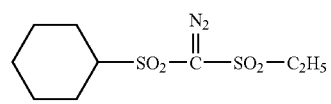
B-62
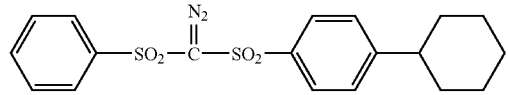
B-63
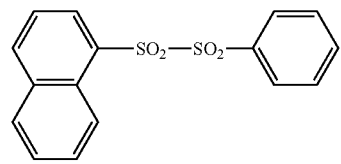
B-64
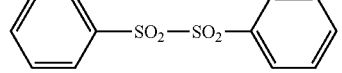
B-65
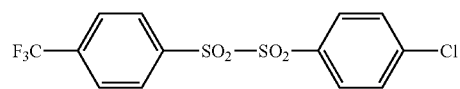
B-66
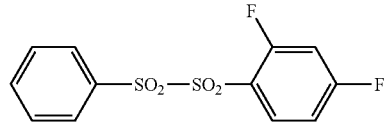

-continued
| | |
|---|---|
| 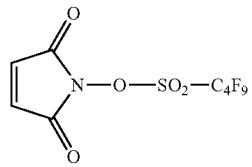 B-67 | 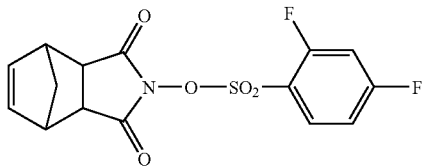 B-68 |
| 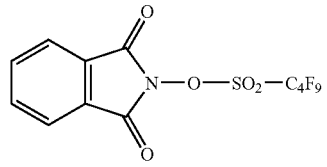 B-69 | 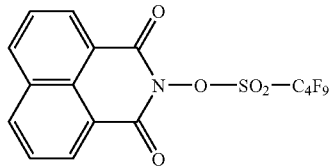 B-70 |
| 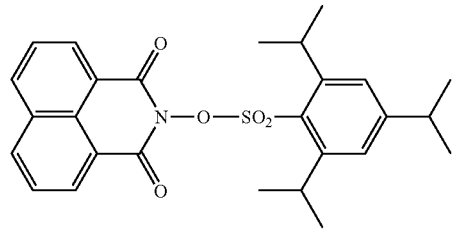 B-71 | 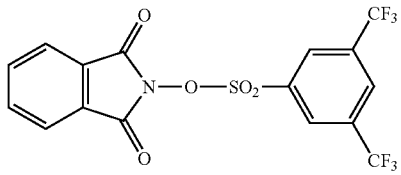 B-72 |
| 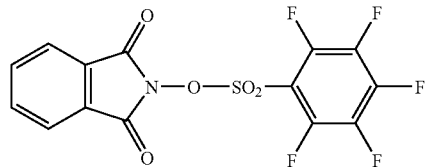 B-73 | 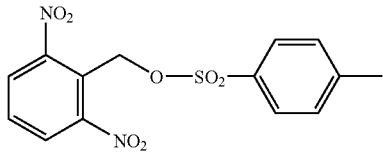 B-74 |
| 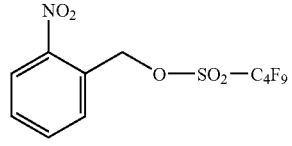 B-75 | 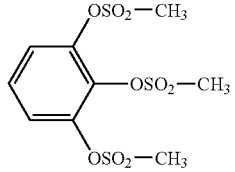 B-76 |
| 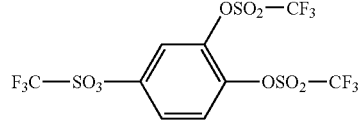 | |
B-77
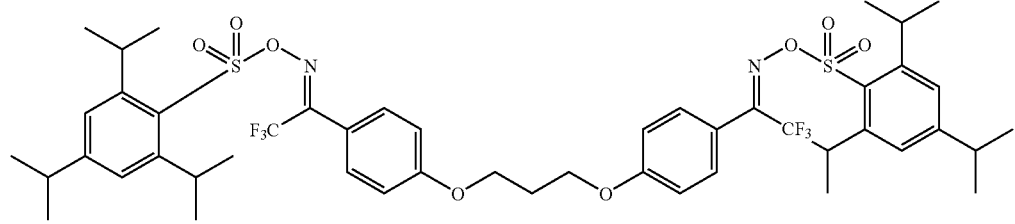
B-78
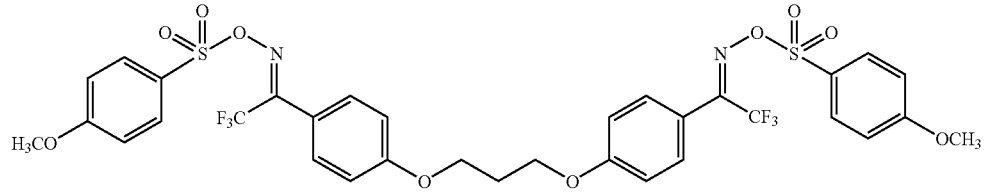
B-79

-continued

B-80, B-81, B-82, B-83 (chemical structures)

The content of the compound (B) is from 5 to 20 mass %, preferably from 6 to 18 mass %, more preferably from 7 to 16 mass %, based on the entire solid content of the resist composition. The content is 5 mass % or more in view of sensitivity or line edge roughness and 20 mass % or less in view of resolving power, pattern profile and film quality. One species of the compound (B) may be used, or two or more species thereof may be mixed and used. For example, a compound capable of generating an arylsulfonic acid upon irradiation with actinic rays or radiation and a compound capable of generating an alkylsulfonic acid upon irradiation with actinic rays or radiation may be used in combination as the compound (B).

The compound (B) can be synthesized by a known method such as a synthesis method described in JP-A-2002-27806.

<Compound (C) Capable of Generating a Carboxylic Acid Upon Irradiation with Actinic Rays or Radiation>

In the positive resist composition of the present invention, a compound capable of generating a carboxylic acid upon irradiation with actinic rays or radiation (sometimes referred to as a "compound (C)" or a "carboxylic acid generator") may be used in combination with the sulfonic acid generator (compound (B)).

The carboxylic acid generator is preferably a compound represented by the following formula (C):

$$R_{22}-Z^{+}\begin{array}{c}R_{21}\\|\\|\\(R_{23})_p\end{array} \quad R_{24}-COO^{-} \quad (C)$$

In formula (C), $R_{21}$ to $R_{23}$ each independently represents an alkyl group, a cycloalkyl group, an alkenyl group or an aryl group, $R_{24}$ represents a hydrogen atom, an alkyl group, a cycloalkyl group, an alkenyl group or an aryl group, and Z represents a sulfur atom or an iodine atom. When Z is a sulfur atom, p is 1, and when Z is an iodine atom, p is 0.

In formula (C), $R_2$, to $R_{23}$ each independently represents an alkyl group, a cycloalkyl group, an alkenyl group or an aryl group, and these groups each may have a substituent.

Examples of the substituent which the alkyl group, cycloalkyl group and alkenyl group each may have include a halogen atom (e.g., chlorine, bromine, fluorine), an aryl group (e.g., phenyl, naphthyl), a hydroxy group and an alkoxy group (e.g., methoxy, ethoxy, butoxy).

Examples of the substituent which the aryl group may have include a halogen atom (e.g., chlorine, bromine, fluorine), a nitro group, a cyano group, an alkyl group (e.g., methyl, ethyl, tert-butyl, tert-amyl, octyl), a hydroxy group and an alkoxy group (e.g., methoxy, ethoxy, butoxy).

$R_{21}$ to $R_{23}$ each is independently preferably an alkyl group having a carbon number of 1 to 12, a cycloalkyl group having a carbon number of 3 to 12, an alkenyl group having a carbon number of 2 to 12 or an aryl group having a carbon number of 6 to 24, more preferably an alkyl group having a carbon number of 1 to 6, a cycloalkyl group having a carbon number of 3 to 6 or an aryl group having a carbon number of 6 to 18, still more preferably an aryl group having a carbon number of 6 to 15, and these groups each may have a substituent.

$R_{24}$ represents a hydrogen atom, an alkyl group, a cycloalkyl group, an alkenyl group or an aryl group.

Examples of the substituent which the alkyl group, cycloalkyl group and alkenyl group each may have are the same as those of the substituent described above when $R_{21}$ is an alkyl group. Examples of the substituent for the aryl group are the same as those of the substituent described above when $R_{21}$ is an aryl group.

$R_{24}$ is preferably a hydrogen atom, an alkyl group having a carbon number of 1 to 30, a cycloalkyl group having a carbon number of 3 to 30, an alkenyl group having a carbon number of 2 to 30 or an aryl group having a carbon number of 6 to 24, more preferably an alkyl group having a carbon number of 1 to 18, a cycloalkyl group having a carbon number of 3 to 18 or an aryl group having a carbon number of 6 to 18, still more preferably an alkyl group having a carbon number of 1 to 12, a cycloalkyl group having a carbon number of 3 to 12 or an aryl group having a carbon number of 6 to 15. These groups each may have a substituent.

Z represents a sulfur atom or an iodine atom. p is 1 when Z is a sulfur atom, and 0 when Z is an iodine atom.

Incidentally, two or more cation moieties of formula (C) may combine through a single bond or a linking group (e.g., —S—, —O—) to form a cation structure having a plurality of cation moieties of formula (C).

Specific preferred examples of the compound (C) capable of generating a carboxylic acid upon irradiation with actinic rays or radiation are set forth below, but the present invention is of course not limited thereto.

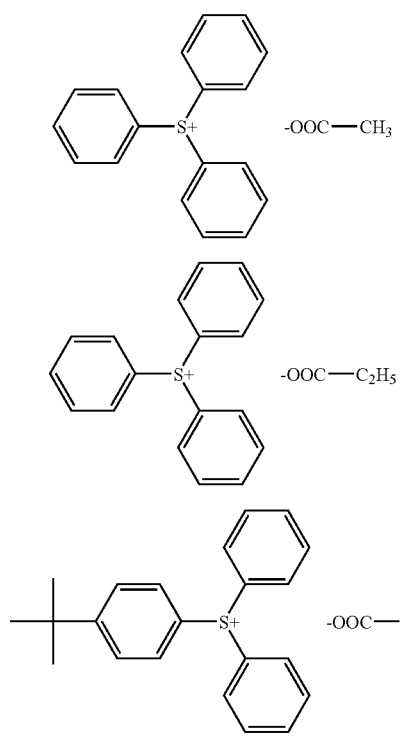

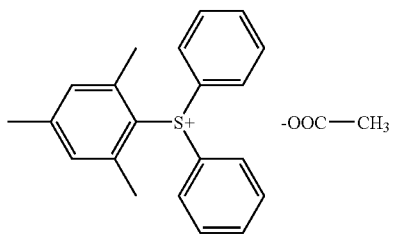

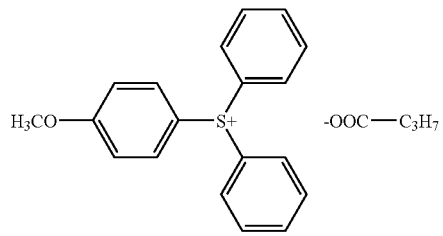

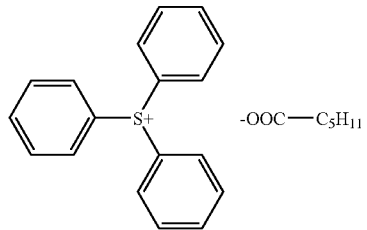

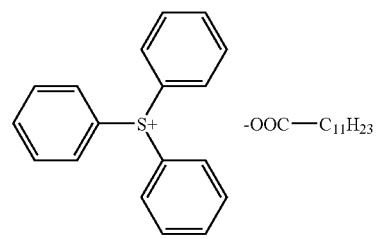

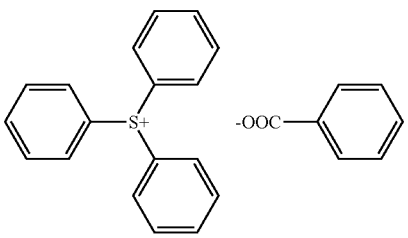

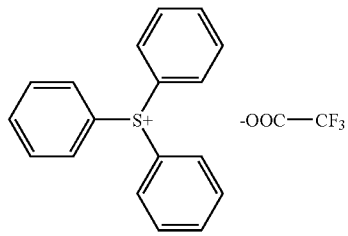

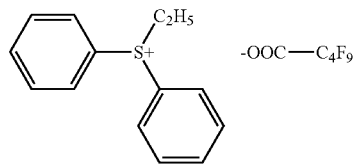

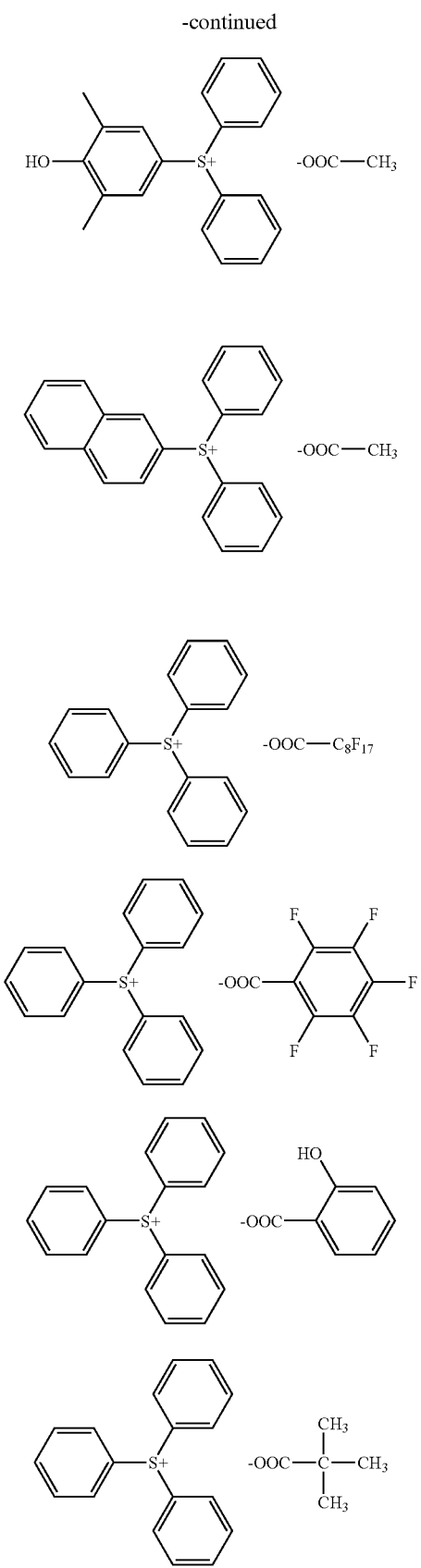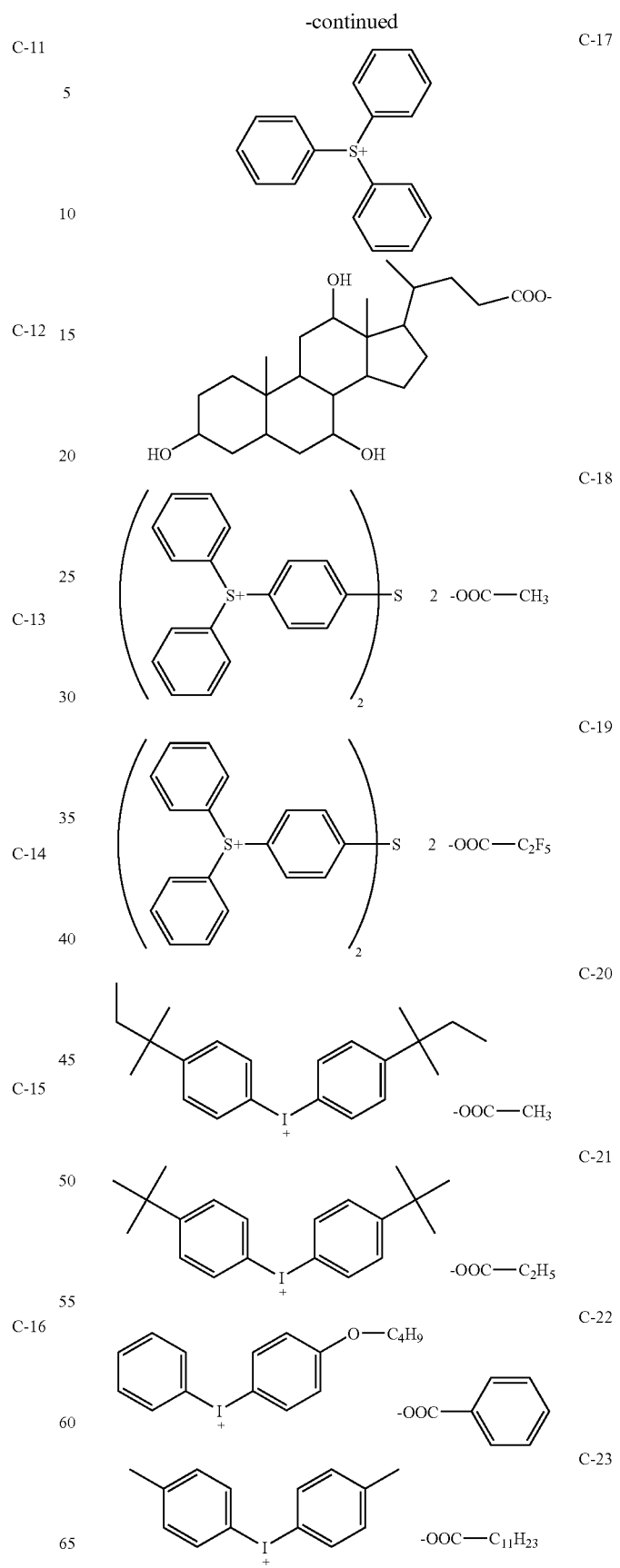

-continued

C-24

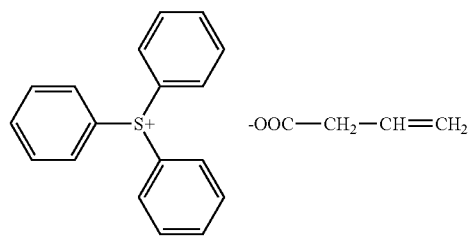

C-25

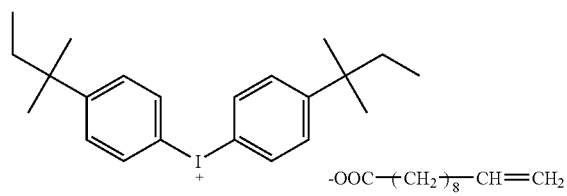

The content of the compound (C) in the positive resist composition of the present invention is preferably from 0.01 to 10 mass %, more preferably from 0.03 to 5 mass %, still more preferably from 0.05 to 3 mass %, based on the entire solid content of the composition. One of these compounds capable of generating a carboxylic acid upon irradiation with actinic rays or radiation may be used, or two or more species thereof may be mixed and used.

The compound (C)/compound (B) (ratio by mass) is usually from 99.9/0.1 to 50/50, preferably from 99/1 to 60/40, more preferably from 98/2 to 70/30.

The compound (C) can be synthesized by a known method such as a synthesis method described in JP-A-2002-27806.

[3] Organic Basic Compound

In the present invention, an organic basic compound (base) is preferably used from the standpoint of, for example, enhancing the performance such as resolving power or the storage stability. The organic basic compound is more preferably a compound containing a nitrogen atom (nitrogen-containing basic compound).

The organic basic compound preferred in the present invention is a compound having basicity stronger than that of phenol.

The preferred chemical environment thereof includes structures of the following formulae (A) to (E). The structures of formulae (B) to (E) each may form a part of a ring structure.

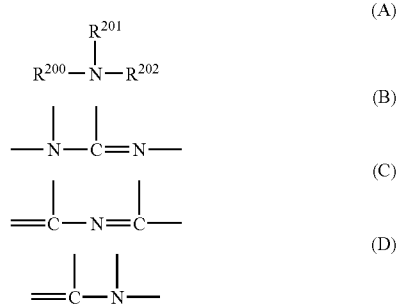

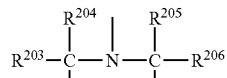

In formula (A), $R^{200}$, $R^{201}$ and $R^{202}$, which may be the same or different, each represents a hydrogen atom, an alkyl group or cycloalkyl group having a carbon number of 1 to 20 or an aryl group having a carbon number of 6 to 20, and $R^{201}$ and $R^{202}$ may combine with each other to form a ring.

The alkyl group, cycloalkyl group and aryl group as $R^{200}$, $R^{201}$ and $R^{202}$ each may have a substituent. The alkyl group or cycloalkyl group having a substituent is preferably an aminoalkyl group or aminocycloalkyl group having a carbon number of 1 to 20 or a hydroxyalkyl group having a carbon number of 1 to 20.

In formula (E), $R^{203}$, $R^{204}$, $R^{205}$ and $R^{206}$, which may be the same or different, each represents an alkyl group or cycloalkyl group having a carbon number of 1 to 6.

The compound is more preferably a nitrogen-containing basic compound having two or more nitrogen atoms differing in the chemical environment within one molecule, still more preferably a compound containing both a substituted or unsubstituted amino group and a nitrogen-containing ring structure, or a compound having an alkylamino group.

Specific preferred examples thereof include guanidine, aminopyridine, aminoalkylpyridine, aminopyrrolidine, indazole, imidazole, pyrazole, pyrazine, pyrimidine, purine, imidazoline, pyrazoline, piperazine, aminomorpholine and aminoalkylmorpholine. Preferred examples of the substituent which these compounds each may have include an amino group, an alkylamino group, an aminoaryl group, an arylamino group, an alkyl group (as the substituted alkyl group, an aminoalkyl group in particular), an alkoxy group, an acyl group, an acyloxy group, an aryl group, an aryloxy group, a nitro group, a hydroxyl group and a cyano group.

More preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

One of these nitrogen-containing basic compounds may be used alone, or two or more species thereof may be used in combination.

A tetraalkylammonium salt-type nitrogen-containing basic compound may also be used. Among such compounds, a tetraalkylammonium hydroxide having a carbon number of 1 to 8 (e.g., tetramethylammonium hydroxide, tetraethylammonium hydroxide, tetra-(n-butyl)ammonium hydroxide) is preferred. One of these nitrogen-containing basic compounds may be used alone, or two or more species thereof may be used in combination.

As for the ratio between the acid generator and the organic basic compound used in the composition, the (total amount of acid generator)/(organic basic compound) (ratio by mol) is preferably from 2.5 to 300. When this molar ratio is 2.5 or more, high sensitivity is obtained, and when the molar ratio is 300 or less, the resist pattern can be prevented from thickening in aging after exposure until heat treatment and the resolving power can be enhanced. The (total amount of acid generator)/(organic basic compound) (ratio by mol) is more preferably from 5.0 to 200, still more preferably from 7.0 to 150.

[4] Surfactants

In the present invention, surfactants can be used and use thereof is preferred in view of film-forming property, adhesion of pattern, reduction in development defects, and the like.

Specific examples of the surfactant include a nonionic surfactant such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylallyl ethers (e.g., polyoxyethylene octylphenol ether, polyoxyethylene nonylphenol ether), polyoxyethylene-polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); a fluorine-containing surfactant and a silicon-containing surfactant, such as EFtop EF301, EF303 and EF352 (produced by Shin-Akita Chemical Co., Ltd.), Megafac F171 and F173 (produced by Dainippon Ink & Chemicals, Inc.), Florad FC430 and FC431 (produced by Sumitomo 3M Inc.), Asahi-guard AG710, Surflon S-382, SC101, SC102, SC103, SC104, SC105 and SC106 (produced by Asahi Glass Co., Ltd.), and Troysol S-366 (produced by Troy Chemical Industries, Inc.); an organosiloxane polymer, KP-341 (produced by Shin-Etsu Chemical Co., Ltd.); and acrylic acid-based or methacrylic acid-based (co)polymers, Polyflow No. 75 and No. 95 (produced by Kyoeisha Yushi Kagaku Kogyo Co., Ltd.). The amount of such a surfactant blended is usually 2 parts by mass or less, preferably 1 part by mass or less, per 100 parts by mass of the solid content in the composition of the present invention.

One of these surfactants may be used alone or several species thereof may be added in combination.

As for the surfactant, the composition preferably contains any one species of fluorine- and/or silicon-containing surfactants (a fluorine-containing surfactant, a silicon-containing surfactant or a surfactant containing both a fluorine atom and a silicon atom), or two or more species thereof.

Examples of these surfactants include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include a fluorine-containing or silicon-containing surfactant such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, a polysiloxane polymer, KP-341 (produced by Shin-Etsu Chemical Co., Ltd.), may also be used as the silicon-containing surfactant.

Other than these known surfactants, a surfactant using a polymer having a fluoroaliphatic group derived from a fluoroaliphatic compound produced by a telomerization process (also called a telomer process) or an oligomerization process (also called an oligomer process) may be used. The fluoroaliphatic compound can be synthesized by the method described in JP-A-2002-90991.

The polymer having a fluoroaliphatic group is preferably a copolymer of a fluoroaliphatic group-containing monomer with a (poly(oxyalkylene))acrylate and/or a (poly(oxyalkylene))methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoroaliphatic group-containing monomer with a (poly(oxyalkylene))acrylate (or methacrylate) may be not only a binary copolymer but also a ternary or higher copolymer obtained by simultaneously copolymerizing two or more different fluoroaliphatic group-containing monomers or two or more different (poly(oxyalkylene))acrylates (or methacrylates).

Examples thereof include commercially available surfactants such as Megafac F178, F-470, F-473, F-475, F-476 and F-472 (produced by Dainippon Ink & Chemicals, Inc.), and further include a copolymer of a $C_6F_{13}$ group-containing acrylate (or methacrylate) with a (poly(oxyalkylene))acrylate (or methacrylate), a copolymer of a $C_6F_{13}$ group-containing acrylate (or methacrylate) with (poly(oxyethylene))acrylate (or methacrylate) and (poly(oxypropylene))acrylate (or methacrylate), a copolymer of a $C_8F_{17}$ group-containing acrylate (or methacrylate) with a (poly(oxyalkylene))acrylate (or methacrylate), and a copolymer of a $C_8F_{17}$ group-containing acrylate (or methacrylate) with (poly(oxyethylene))acrylate (or methacrylate) and (poly(oxypropylene))acrylate (or methacrylate).

The amount of the surfactant used is preferably from 0.0001 to 2 mass %, more preferably from 0.001 to 1 mass %, based on the entire amount of the positive resist composition (excluding the solvent).

[5] Other Components

The positive resist composition of the present invention may further contain, if desired, a dye, a photobase generator and the like.

1. Dye

In the present invention, a dye may be used.

The suitable dye includes an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photobase Generator

Examples of the photobase generator which can be added to the composition of the present invention include the compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photobase generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. Such a photobase generator is added for the purpose of improving the resist profile or the like.

3. Solvents

The resist composition of the present invention is dissolved in a solvent capable of dissolving respective components described above and then coated on a support. Usually, the concentration is, in terms of the solid content concentration of all resist components, preferably from 2 to 30 mass %, more preferably from 3 to 25 mass %.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methylpyruvate, ethyl pyruvate, propyl pyruvate, N,N-dimethylformamide, dimethylsulfoxide, N-methylpyrrolidone and tetrahydrofuran. One of these solvents is used alone, or several species thereof are mixed and used.

When the resist composition of the present invention is used for immersion exposure, it is preferred to add a fluorine system resin, a silicon system resin or a hydrocarbon system resin into the resist composition against the specific task for immersion exposure such as inhibition of resist composition elution and decrease of watermark defect. Alternatively, a top coat can be coated on the coating of the resist.

The positive resist composition of the present invention is coated on a substrate to form a thin film. The thickness of this coating film is preferably from 0.05 to 4.0 μm.

In the present invention, a commercially available inorganic or organic antireflection film may be used, if desired. Furthermore, the antireflection film may be used by coating it as an underlayer of the resist.

The antireflection film used as the underlayer of the resist may be either an inorganic film type such as titanium, titanium dioxide, titanium nitride, chromium oxide, carbon and amorphous silicon, or an organic film type comprising a light absorbent and a polymer material. The former requires equipment for the film formation, such as vacuum deposition apparatus, CVD apparatus and sputtering apparatus. Examples of the organic antireflection film include a film comprising a diphenylamine derivative/formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film containing a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising a methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series and DUV-40 Series produced by Brewer Science, Inc.; and AR-2, AR-3 and AR-5 produced by Shipley Co., Ltd.

In the production or the like of a precision integrated circuit device, the step of forming a pattern on a resist film is performed by coating the positive resist composition of the present invention on a substrate (for example, a silicon/silicon dioxide-coated substrate, a glass substrate, an ITO substrate or a quartz/chromium oxide-coated substrate) to form a resist film, irradiating thereon actinic rays or radiation such as KrF excimer laser light, electron beam or EUV light, and then subjecting the resist film to heating, development, rinsing and drying, whereby a good resist pattern can be formed.

The alkali developer which can be used in the development is an aqueous solution of an alkali (usually, 0.1 to 20 mass %) such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline) and cyclic amines (e.g., pyrrole, piperidine). This aqueous solution of an alkali may be used after adding thereto alcohols such as isopropyl alcohol or a surfactant such as nonionic surfactant in an appropriate amount.

Among these developers, a quaternary ammonium salt is preferred, and tetramethylammonium hydroxide and choline are more preferred.

The pH of the alkali developer is usually from 10 to 15.

Example 1

The present invention is described in greater detail below by referring to Examples, but the present invention should not be construed as being limited thereto.

Synthesis Example 1

Synthesis of Resin A-2 as Resin (A)

Acetoxystyrene, 1-phenylethyl methacrylate and styrene were charged at a ratio of 60/25/15 (by mol) and dissolved in tetrahydrofuran to prepare 100 mL of a solution having a solid content concentration of 20 mass %. Subsequently, 2 mol % of a polymerization initiator, V-65, produced by Wako Pure Chemical Industries, Ltd. was added thereto and the resulting solution was added dropwise to 10 ml of tetrahydrofuran heated at 60° C., over 4 hours in a nitrogen atmosphere. After the completion of dropwise addition, the reaction solution was heated for 4 hours, and 1 mol % of V-65 was again added, followed by stirring for 4 hours. After the completion of reaction, the reaction solution was cooled to room temperature and then crystallized in 3 L of hexane, and the precipitated white powder was collected by filtration.

The compositional ratio of the polymer determined from $C^{13}$NMR was 58/26/16 (by mol). Also, the weight average molecular weight determined by GPC was 10,000 in terms of the standard polystyrene.

This polymer was dissolved in 100 ml of acetone, 5 ml of hydrochloric acid was then added thereto and after stirring 1 hour, distilled water was added to precipitate the polymer. The precipitate was washed with distilled water and dried under reduced pressure. Furthermore, the polymer was dissolved in 100 ml of ethyl acetate and after adding hexane, the polymer precipitated was dried under reduced pressure to obtain a powder form of the polymer. The weight average molecular weight of this powder determined by GPC was 9,500 in terms of the standard polystyrene.

Synthesis Example 2

Synthesis of Resin A-2' as Resin (A)

Phenylthiocarbonyl disulfide (0.7 g) was added to a solution obtained by dissolving 9.8 g of acetoxystyrene, 4.7 g of 1-phenylethyl methacrylate and 1.6 g of styrene in 16 g of tetrahydrofuran and furthermore, 1.5 g of a polymerization initiator, V-65, produced by Wako Pure Chemical Industries, Ltd. was added thereto. The resulting solution was heated with stirring for 10 hours in a nitrogen atmosphere. After the completion of reaction, the reaction solution was cooled to room temperature and then crystallized in 3 L of hexane, and the precipitated white powder was collected by filtration.

The compositional ratio of the polymer determined from $C^{13}$NMR was 58/26/16 (by mol). Also, the weight average molecular weight determined from GPC was 10,000 in terms of the standard polystyrene.

This polymer was dissolved in 100 ml of acetone, 5 ml of hydrochloric acid was then added thereto and after stirring 1 hour, distilled water was added to precipitate the polymer. The precipitate was washed with distilled water and dried under reduced pressure. Furthermore, the polymer was dissolved in 100 ml of ethyl acetate and after adding hexane, the polymer precipitated was dried under reduced pressure to obtain a powder form of the polymer. The weight average molecular weight of this powder determined by GPC was 9,200 in terms of the standard polystyrene, and Mw/Mn (molecular weight distribution) was 1.05.

The resins shown in Table 1, having structures set forth above, were synthesized in the same manner as in Synthesis Examples 1 and 2. Here, A-2' was synthesized using living radical polymerization although A-2' has the same repeating units as A-2.

TABLE 1

| Polymer | Repeating Unit (mol %) | Weight Average Molecular Weight | Dispersity |
| --- | --- | --- | --- |
| A-2 | 58/26/16 | 9500 | 1.89 |
| A-4 | 65/20/15 | 10500 | 1.65 |
| A-6 | 65/20/15 | 8000 | 1.59 |
| A-8 | 65/20/15 | 9000 | 1.75 |
| A-12 | 68/16/16 | 10000 | 1.75 |
| A-14 | 70/20/10 | 9500 | 1.82 |
| A-16 | 70/20/10 | 7500 | 1.65 |
| A-20 | 65/35 | 8900 | 1.52 |
| A-22 | 63/37 | 7480 | 1.59 |
| A-24 | 72/28 | 7600 | 1.75 |
| A-26 | 75/25 | 8900 | 1.79 |
| A-28 | 69/31 | 9600 | 1.63 |
| A-30 | 64/36 | 8100 | 1.85 |
| A-32 | 74/26 | 7600 | 1.84 |
| A-34 | 70/20/10 | 9400 | 1.74 |
| A-36 | 74/16/10 | 8200 | 1.69 |
| A-38 | 64/21/15 | 10200 | 1.58 |
| A-40 | 64/24/12 | 10700 | 1.71 |
| A-42 | 57/24/19 | 8300 | 1.83 |

TABLE 1-continued

| Polymer | Repeating Unit (mol %) | Weight Average Molecular Weight | Dispersity |
| --- | --- | --- | --- |
| A-44 | 64/24/12 | 7800 | 1.79 |
| A-46 | 51/20/29 | 9900 | 1.69 |
| A-48 | 65/20/15 | 6900 | 1.66 |
| A-2' | 58/26/16 | 9200 | 1.05 |

The repeating units of the composition above are from the left in the structure.

The acid generators all were synthesized by a known synthesis method such as a synthesis method described in JP-A-2002-27806.

Example 1

(1) Preparation and Coating of Positive Resist

| Resin A-2 | 0.93 g |
| --- | --- |
| Sulfonic Acid Generator B-2 | 0.07 g |

These components were dissolved in 8.8 g of propylene glycol monomethyl ether acetate, and 0.003 g of D-1 (see below) as the organic basic compound and 0.001 g of Megafac F176 (produced by Dainippon Ink & Chemicals, Inc., hereinafter simply referred to as "W-1") as the surfactant were further added thereto and dissolved. The obtained solution was microfiltered through a membrane filter having a pore size of 0.1 μm to obtain a resist solution.

This resist solution was coated on a silicon wafer coated with DUV-42 by using a spin coater, Mark 8, manufactured by Tokyo Electron Ltd. and then baked at 110° C. for 90 seconds to obtain a uniform film having a thickness of 0.25 μm.

(2) Production of Positive Resist Pattern

The resist film formed above was then irradiated with electron beams by using an electron beam image-drawing apparatus (HL750, manufactured by Hitachi Ltd., accelerating voltage: 50 KeV). After the irradiation, the resist film was baked at 110° C. for 90 seconds, dipped in an aqueous 2.38 mass % tetramethylammonium hydroxide (TMAH) solution for 60 seconds, rinsed with water for 30 seconds and then dried. The obtained pattern was evaluated by the following methods.

(2-1) Sensitivity

The cross-sectional profile of the pattern obtained was observed using a scanning electron microscope (S-4300, manufactured by Hitachi, Ltd.). The minimum irradiation energy for resolving a 0.15-μm line (line:space=1:1) was defined as the sensitivity.

(2-2) LWR (Line Width Roughness)

With respect to a resist pattern obtained in the same manner as above, the line width was observed by a scanning electron microscope (S-9220, manufactured by Hitachi, Ltd.) to inspect the line width fluctuation (LWR) in the line width of 130 nm. The line width was detected at a plurality of positions in the measuring monitor by using a length-measuring scanning electron microscope (SEM), and the amplitude dispersion (3a) at the detection positions was used as an index for LWR.

(2-3) Defocus Latitude Depended on Line Pitch

In a 0.15-μm line pattern at the irradiation dose giving the above-described sensitivity, the line width of a dense pattern (line:space=1:1) and the line width of an isolated pattern were measured. The difference therebetween was defined as the defocus latitude depended on line pitch.

The results of Example 1 were good, that is, the sensitivity was 10.0 μC/cm$^2$, LWR was 6.8 nm, and the defocus latitude depended on line pitch was 11 nm. The evaluation results are shown in Table 2.

Examples 2 to 7 and Comparative Example 1

Using the compounds shown in Table 2, the preparation and coating of resist and the evaluation in electron beam exposure were performed thoroughly in the same manner as in Example 1. The evaluation results are shown in Table 2.

The component (c) and other components used in Examples and the resin used in Comparative Example are shown below.

(3-1) Sensitivity

The cross-sectional profile of the pattern obtained was observed using a scanning electron microscope (S-4300, manufactured by Hitachi, Ltd.). The minimum irradiation energy for resolving a 0.18-μm line (line:space=1:1) was defined as the sensitivity.

(3-2) LWR (Line Width Roughness)

With respect to a resist pattern obtained in the same manner as above, the line width was observed by a scanning electron microscope (S-9220, manufactured by Hitachi, Ltd.) to inspect the line width fluctuation (LWR) in the line width of 130 nm. The line width was detected at a plurality of positions in the measuring monitor by using a length-measuring scanning electron microscope (SEM), and the amplitude dispersion (3%) at the detection positions was used as an index for LWR.

TABLE 2

| | Resin | Acid Generator | Base (0.003 g) | Others (0.001 g) | Sensitivity (μC/cm$^2$) | LWR (nm) | Defocus Latitude Depended on Line Pitch (nm) |
|---|---|---|---|---|---|---|---|
| Example 1 | A-2 (0.93 g) | B-2 (0.07 g) | D-1 | W-1 | 10.0 | 6.8 | 11 |
| Example 2 | A-4 (0.95 g) | B-4 (0.07 g) | D-2 | W-1 | 10.0 | 7.2 | 12 |
| Example 3 | A-6 (0.95 g) | B-16 (0.07 g) | D-1 | W-2 | 11.0 | 6.9 | 11 |
| Example 4 | A-8 (0.85 g) | B-17 (0.07 g) | D-3 | W-1 | 11.0 | 7.3 | 12 |
| Example 5 | A-12 (0.85 g) | B-17 (0.07 g) | D-3 | W-1 | 12.0 | 8.1 | 10 |
| Example 6 | A-14 (0.85 g) | B-17 (0.07 g) | D-3 | W-1 | 11.0 | 6.5 | 10 |
| Example 7 | A-16 (0.85 g) | B-17 (0.07 g) | D-3 | W-1 | 10.0 | 8.0 | 11 |
| Comparative Example 1 | C-1* (0.93 g) | B-2 (0.07 g) | D-1 | W-1 | 12.0 | 9.8 | 15 |

C-1*

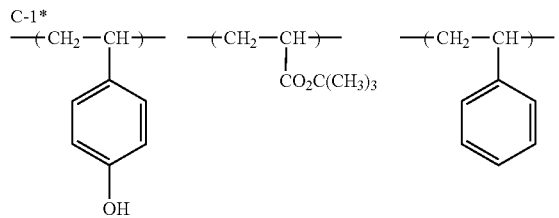

Molar compositional ratio: 65/20/15
Weight average molecular weight: 9,500
Dispersity: 1.88

It is seen from Table 2 that as regards the pattern formation by the irradiation with electron beams, the positive resist composition of the present invention exhibits high sensitivity and high resolving power and is excellent in the pattern profile and defocus latitude depended on line pitch, as compared with the case using the compound of Comparative Example 1.

Example 8

The preparation and coating of each resist shown in Table 3 were performed in the same manner as in Example 1 to obtain a resist film, except that the amount of Resin A-2 added was changed to 0.930 g and the amount of Sulfonic Acid Generator B-2 added was changed to 0.030 g. The film thickness was 0.40 μm.

(3) Formation of Positive Pattern

The resist film obtained was pattern-exposed using a KrF excimer laser stepper (FPA-3000EX-5, manufactured by Canon Inc., wavelength: 248 nm). The processing after the exposure was performed in the same manner as in Example 1. The evaluation of the pattern was performed as follows.

(3-3) Defocus Latitude Depended on Line Pitch

In a 0.18-μm line pattern at the irradiation dose giving the above-described sensitivity, the line width of a dense pattern (line:space=1:1) and the line width of an isolated pattern were measured. The difference therebetween was defined as the defocus latitude depended on line pitch. The evaluation results are shown in Table 3.

Examples 9 to 30 and Example 48, and Comparative Examples 2 and 3

The preparation and coating of a resist were performed thoroughly in the same manner as in Example 8 by using the compounds shown in Table 3, and the evaluation in KrF excimer laser exposure was performed. The evaluation results are shown in Table 3.

TABLE 3

|  | Resin | Acid Generator | Base (0.003 g) | Others (0.001 g) | Sensitivity (mJ/cm$^2$) | LWR (nm) | Defocus Latitude Depended on Line Pitch (nm) |
|---|---|---|---|---|---|---|---|
| Example 8 | A-2 (0.93 g) | B-2 (0.03 g) | D-1 | W-1 | 21.5 | 6.5 | 8 |
| Example 9 | A-4 (0.95 g) | B-4 (0.03 g) | D-2 | W-1 | 22.5 | 6.3 | 8 |
| Example 10 | A-12 (0.95 g) | B-16 (0.025 g) C-1 (0.01 g) | D-1 | W-2 | 20.5 | 6.8 | 9 |
| Example 11 | A-14 (0.95 g) | B-17 (0.025 g) C-8 (0.01 g) | D-3 | W-1 | 19.5 | 7.0 | 9 |
| Example 12 | A-3 (0.93 g) | B-58 (0.03 g) | D-1 | W-1 | 20.5 | 6.5 | 8 |
| Example 13 | A-3 (0.93 g) | B-59 (0.03 g) | D-2 | W-1 | 23.5 | 6.8 | 9 |
| Example 14 | A-5 (0.55 g) A-1 (0.35 g) | B-16 (0.03 g) | D-1 | W-2 | 20.0 | 6.5 | 9 |
| Example 15 | A-6 (0.55 g) R-4 (0.35 g) | B-17 (0.03 g) | D-3 | W-1 | 21.0 | 6.5 | 8 |
| Example 16 | A-7 (0.55 g) R-7 (0.35 g) | B-2 (0.03 g) | D-1 | W-1 | 19.0 | 7.0 | 9 |
| Example 17 | A-8 (0.55 g) R-8 (0.35 g) | B-4 (0.03 g) | D-2 | W-1 | 20.5 | 6.4 | 9 |
| Example 18 | A-9 (0.35 g) R-9 (0.55 g) | B-16 (0.03 g) | D-1 | W-2 | 21.0 | 6.6 | 9 |
| Example 19 | A-10 (0.55 g) R-11 (0.35 g) | B-2 (0.03 g) | D-1 | W-1 | 22.0 | 6.9 | 8 |
| Example 20 | A-11 (0.95 g) | B-2 (0.03 g) B-58 (0.01 g) | D-2 | W-1 | 19.5 | 6.5 | 8 |
| Example 21 | A-12 (0.85 g) | B-81 (0.03 g) | D-1 | W-2 | 21.0 | 7.0 | 9 |
| Example 22 | A-13 (0.95 g) | B-83 (0.03 g) | D-3 | W-1 | 19.5 | 6.6 | 8 |
| Example 23 | A-14 (0.95 g) | B-4 (0.03 g) C-9 (0.01 g) | D-1 | W-2 | 20.0 | 6.5 | 9 |
| Example 24 | A-40 (0.93 g) | B-2 (0.03 g) | D-1 | W-1 | 20.0 | 6.3 | 8 |
| Example 25 | A-16 (0.93 g) | B-4 (0.03 g) | D-2 | W-1 | 21.0 | 6.5 | 9 |
| Example 26 | A-20 (0.93 g) | B-16 (0.03 g) | D-3 | W-2 | 19.0 | 6.7 | 8 |
| Example 27 | A-27 (0.93 g) | B-17 (0.03 g) | D-1 | W-2 | 20.5 | 6.8 | 9 |
| Example 28 | A-31 (0.93 g) | B-1 (0.03 g) | D-3 | W-1 | 19.5 | 6.5 | 9 |
| Example 29 | A-48 (0.93 g) | B-3 (0.03 g) | D-3 | W-1 | 22.0 | 6.5 | 8 |
| Example 30 | A-2' (0.93 g) | B-2 (0.03 g) | D-2 | W-1 | 20.0 | 6.7 | 9 |
| Comparative Example 2 | C-1* (0.93 g) | B-2 (0.03 g) | D-1 | W-1 | 32.5 | 9.5 | 12 |
| Comparative Example 3 | C-1* (0.93 g) | B-17 (0.03 g) | D-1 | W-1 | 35.0 | 9.9 | 13 |
| Example 48 | A-50 (0.93 g) | B-17 (0.03 g) | D-1 | W-2 | 20.5 | 6.8 | 7 |

It is seen from Table 3 that as regards the pattern formation by the KrF excimer laser exposure, the positive resist composition of the present invention exhibits high sensitivity and high resolving power and is excellent in the pattern profile and defocus latitude depended on line pitch, as compared with the case using the compound of Comparative Example 2.

Examples 31 to 41 and Comparative Examples 4 and 5

Using each resist composition shown in Table 4, a resist film was obtained in the same manner as in Example 1. However, the resist film thickness was changed to 0.13 μm. The resist film obtained was subjected to surface exposure using EUV light (wavelength: 13 nm) by changing the exposure dose in steps of 0.5 mJ in the range from 0 to 5.0 mJ and then baked at 110° C. for 90 seconds. Thereafter, the dissolution rate at each exposure dose was measured using an aqueous 2.38 mass % tetramethylammonium hydroxide (TMAH) solution to obtain a sensitivity curve. The exposure dose when the dissolution rate of the resist was saturated in this sensitivity curve was defined as the sensitivity and also, the dissolution contrast (γ value) was calculated from the gradient in the straight line part of the sensitivity curve. As the γ value is larger, the dissolution contrast is more excellent.

The results are shown in Table 4.

TABLE 4

|  | Resin | Acid Generator | Base (0.003 g) | Others (0.001 g) | Sensitivity (mJ/cm$^2$) | γ value |
|---|---|---|---|---|---|---|
| Example 31 | A-2 (0.93 g) | B-2 (0.05 g) | D-1 | W-1 | 3.0 | 8.5 |
| Example 32 | A-4 (0.85 g) | B-4 (0.045 g) | D-2 | W-1 | 3.0 | 8.5 |
| Example 33 | A-6 (0.75 g) | B-18 (0.04 g) | D-1 | W-1 | 3.0 | 9.0 |
| Example 34 | A-8 (0.85 g) | B-19 (0.05 g) | D-2 | W-3 | 3.0 | 8.5 |

TABLE 4-continued

|  | Resin | Acid Generator | Base (0.003 g) | Others (0.001 g) | Sensitivity (mJ/cm$^2$) | γ value |
|---|---|---|---|---|---|---|
| Example 35 | A-2 (0.93 g) | B-2 (0.05 g) | D-1 | W-1 | 12.1 | 9.5 |
| Example 36 | A-32 (0.35 g) | B-4 (0.03 g) | D-2 | W-1 | 12.3 | 9.3 |
| Example 37 | A-34 (0.35 g) | B-16 (0.03 g) | D-3 | W-2 | 11.9 | 9.6 |
| Example 38 | A-36 (0.25 g) | B-17 (0.03 g) | D-1 | W-2 | 15.2 | 9.1 |
| Example 39 | A-38 (0.35 g) | B-1 (0.03 g) | D-3 | W-1 | 14.2 | 9.2 |
| Example 40 | A-40 (0.35 g) | B-3 (0.03 g) | D-3 | W-3 | 11.6 | 8.9 |
| Example 41 | A-42 (0.35 g) | B-5 (0.03 g) | D-2 | W-3 | 12.9 | 9.6 |
| Comparative Example 4 | C-1* (0.93 g) | B-2 (0.05 g) | D-1 | W-1 | 18.0 | 7.3 |
| Comparative Example 5 | C-1* (0.93 g) | B-2 (0.03 g) | D-1 | W-1 | 20.1 | 7.1 |

It is seen from Table 4 that in the characteristic evaluation by the irradiation with EUV light, the positive resist composition of the present invention exhibits high sensitivity and high contrast and is excellent, as compared with the composition of Comparative Example 3.

Synthesis Example 3

Synthesis of Resin (A-17)

1-Phenylethyl methacrylate, 2-methyl-2-adamantyl methacrylate, norbornane lactone acrylate and hydroxyadamantane methacrylate were charged at a ratio of 15/30/40/20 and dissolved in methyl ethyl ketone/tetrahydrofuran=9/1 to prepare 450 g of a solution having a solid content concentration of 22 mass %. Subsequently, 3 mol % of 2,2'-azobis(2-methylbutyronitrile) was added to the solution prepared above, and the resulting solution was added dropwise to 40 g of methyl ethyl ketone heated at 65° C., over 6 hours in a nitrogen atmosphere. After the completion of dropwise addition, the reaction solution was stirred for 4 hours. After the completion of reaction, the reaction solution was cooled to room temperature and then crystallized in 5 L of a mixed solvent of methanol/ISO propyl alcohol=3/1, and the precipitated white powder was collected by filtration. The obtained powder was reslurried with 1 L of methanol, and the objective Resin (1) was recovered.

The compositional ratio of the polymer determined from NMR was Oct. 32, 1940/18. Also, the weight average molecular weight Mw determined by GPC was 6,500 in terms of the standard polystyrene, and the dispersity (PD) was 2.2.

Resins A-18 and A-19 were synthesized in the same manner.

TABLE 5

| Resin | Repeating Unit (mol %) | Weight Average Molecular Weight | Dispersity |
|---|---|---|---|
| A-17 | 10/32/40/18 | 12500 | 1.85 |
| A-18 | 10/30/45/15 | 11300 | 1.69 |
| A-19 | 10/30/45/15 | 8900 | 1.79 |

Example 42

| (1) Preparation and Coating of Positive Resist | |
|---|---|
| Resin of the Invention | 0.93 g |
| Sulfonic Acid Generator B-2 | 0.03 g |

These components were dissolved in 8.8 g of propylene glycol monomethyl ether acetate, and 0.003 g of D-1 (see below) as the organic basic compound and 0.001 g of Megafac F176 (produced by Dainippon Ink & Chemicals, Inc., hereinafter simply referred to as "W-1") as the surfactant were further added thereto and dissolved. The obtained solution was microfiltered through a membrane filter having a pore size of 0.1 μm to obtain a resist solution.

This resist solution was coated on a 6-inch silicon wafer by using a spin coater, Mark 8, manufactured by Tokyo Electron Ltd. and then baked at 110° C. for 90 seconds to obtain a uniform film having a thickness of 0.25 μm.

(3) Formation of Positive Pattern

The resist film obtained was pattern-exposed using an ArF excimer laser scanner. The processing after the exposure was performed in the same manner as in KrF exposure. The evaluation of the pattern was performed as follows.

(3-1) Sensitivity

The cross-sectional profile of the pattern obtained was observed using a scanning electron microscope (S-4300, manufactured by Hitachi, Ltd.). The minimum irradiation energy for resolving a 0.15-μm line (line:space=1:1) was defined as the sensitivity.

(3-2) LWR (Line Width Roughness)

With respect to a resist pattern obtained in the same manner as above, the line width was observed by a scanning electron microscope (S-9220, manufactured by Hitachi, Ltd.) to inspect the line width fluctuation (LWR) in the line width of 110 nm. The line width was detected at a plurality of positions in the measuring monitor by using a length-measuring scanning electron microscope (SEM), and the amplitude dispersion (3%) at the detection positions was used as an index for LWR.

(3-3) Defocus Latitude Depended on Line Pitch

In a 0.15-μm line pattern at the irradiation dose giving the above-described sensitivity, the line width of a dense pattern (line:space=1:1) and the line width of an isolated pattern were measured. The difference therebetween was defined as the defocus latitude depended on line pitch.

Examples 43 and 44 and Comparative Example 6

The preparation and coating of a resist were performed thoroughly in the same manner as in Example 42 by using the compounds shown in Table 5, and the evaluation in ArF excimer laser exposure was performed. The evaluation results are shown in Table 6 below.

Examples 45 to 47 and Comparative Example 7

The resists films of Examples 42 to 44 and Comparative Example 6 each was pattern-exposed using an ArF excimer laser immersion scanner. The processing after the exposure was performed in the same manner as in KrF exposure. The evaluation of the pattern was performed as follows. The evaluation results are shown in Table 7.

TABLE 6

|  | Resin | Sulfonic Acid Generator | Base (0.003 g) | Others (0.001 g) | Sensitivity (mJ/cm$^2$) | LWR (nm) | Defocus Latitude Depended on Line Pitch (nm) |
|---|---|---|---|---|---|---|---|
| Example 42 | A-17 (0.93 g) | B-2 (0.03 g) | D-1 | W-1 | 30.0 | 6.8 | 11 |
| Example 43 | A-18 (0.95 g) | B-4 (0.03 g) | D-2 | W-1 | 28.0 | 7.2 | 12 |
| Example 44 | A-19 (0.90 g) | B-16 (0.03 g) | D-1 | W-2 | 31.0 | 6.9 | 11 |
| Comparative Example 6 | C-2* (0.93 g) | B-2 (0.03 g) | D-1 | W-1 | 35.0 | 9.8 | 15 |

C-2*

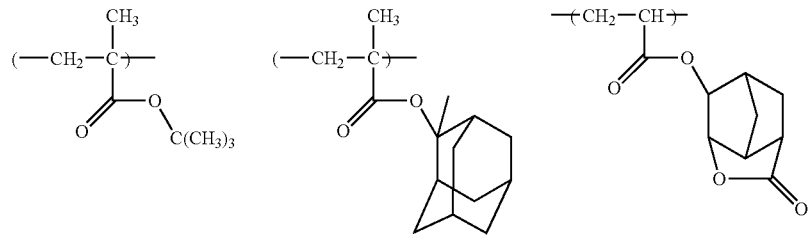

Molar compositional ratio: 15/32/40/18
Weight average molecular weight: 9,500
Dispersity: 1.88

TABLE 7

| | Resin | Sulfonic Acid Generator | Base (0.003 g) | Others (0.001 g) | Additive Resin (0.001 g) | Sensitivity (mJ/cm$^2$) | LWR (nm) | Defocus Latitude Depended on Line Pitch (nm) |
|---|---|---|---|---|---|---|---|---|
| Example 45 | A-17 (0.93 g) | B-2 (0.04 g) | D-1 | W-1 | P1 | 28.6 | 6.9 | 8 |
| Example 46 | A-18 (0.95 g) | B-4 (0.04 g) | D-2 | W-1 | P2 | 26.0 | 7.9 | 10 |
| Example 47 | A-19 (0.95 g) | B-16 (0.04 g) | D-1 | W-2 | P3 | 29.5 | 7.4 | 9 |
| Comparative Example 7 | C-2* (0.93 g) | B-2 (0.04 g) | D-1 | W-1 | P4 | 32.5 | 9.0 | 12 |

Additive Resin
P1: poly(acrylic acid ester), Weight average molecular weight (Mw) 6,000
P2: poly(α-perfluorobutyl trifluoromethyl acrylate), Weight average molecular weight (Mw) 10,000
P3: poly(α-perfluorocyclohexyl acrylate), Weight average molecular weight (Mw) 9,400
P4: poly(α-octyl trifluoromethyl acrylate), Weight average molecular weight (Mw) 12,000

It is seen from the results above that as regards the pattern formation by the ArF excimer laser exposure, the positive resist composition of the present invention exhibits high sensitivity and high resolving power and is excellent in the pattern profile and defocus latitude depended on line pitch, as compared with the compound of Comparative Example.

According to the present invention, as regards the pattern formation by the irradiation of electron beam, KrF excimer laser light, EUV light or the like, a positive resist composition excellent in the sensitivity and line width roughness and further excellent in the defocus latitude depended on line pitch and a pattern forming method using the composition can be provided.

The entire disclosure of each and every foreign patent application from which the benefit of foreign priority has been claimed in the present application is incorporated herein by reference, as if fully set forth.

What is claimed is:

1. A resist composition, which comprises:

(A) a resin containing a repeating unit represented by formula (I); and (B) a compound capable of generating a sulfonic acid upon irradiation with actinic rays or radiation, the resist composition being of the chemical amplification type:

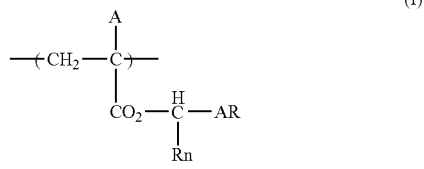

wherein AR represents an aryl group;

Rn represents an alkyl group, a cycloalkyl group or an aryl group; and

A represents an atom or group selected from the group consisting of a hydrogen atom, an alkyl group, a halogen atom, a cyano group and an alkyloxycarbonyl group.

2. The resist composition according to claim 1, wherein (A) the resin containing a repeating unit represented by formula (I) further contains a repeating unit represented by formula (A1):

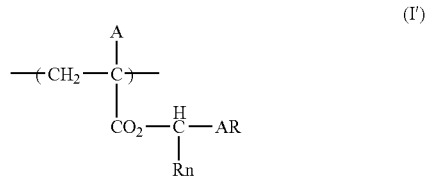

wherein n represents an integer of 0 to 3;

m represents an integer of 0 to 3, provided that m+n≦5;

$A_1$ represents a group capable of decomposing under an action of an acid or a group containing a group capable of decomposing under an action of an acid, and when a plurality of $A_1$s are present, the plurality of $A_1$s may be the same or different; and $S_1$ represents a substituent, and when a plurality of $S_1$s are present, the plurality of $S_1$s may be the same or different.

3. The resist composition according to claim 2, wherein in the repeating unit represented by formula (A1), $A_1$ represents a group containing an acetal or ketal group.

4. A resist composition, which comprises:

(A) a resin containing a repeating unit represented by formula (I') and a repeating unit represented by formula (A1'); and (B) a compound capable of generating an acid upon irradiation with actinic rays or radiation:

wherein AR represents an aryl group;

Rn represents an alkyl group having a carbon number of 2 to 18, a cycloalkyl group having a carbon number of 3 to 18 or an aryl group having a carbon number of 6 to 10; and A represents an atom or group selected from the group consisting of a hydrogen atom, an alkyl group, a halogen atom, a cyano group and an alkyloxycarbonyl group;

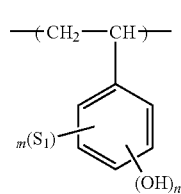
(A1')

wherein n represents an integer of 0 to 3;
m represents an integer of 0 to 3, provided that m+n≦5; and
$S_1$ represents a substituent, and when a plurality of $S_1$s are present, the plurality of $S_1$s may be the same or different.

5. The resist composition according to claim 1,
wherein (A) the resin containing a repeating unit represented by formula (I) further contains a repeating unit represented by formula (A2):

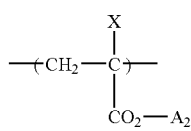
(A2)

wherein $A_2$ represents a group capable of decomposing under an action of an acid or a group containing a group capable of decomposing under an action of an acid; and
X represents an atom or group selected from the group consisting of a hydrogen atom, an alkyl group, a halogen atom, a $CF_3$ group, a cyano group, an alkyloxycarbonyl group, an alkyloxycarbonylmethyl group, an alkylcarbonyloxymethyl group, a hydroxymethyl group and an alkoxymethyl group.

6. The resist composition according to claim 5,
wherein in the repeating unit represented by formula (A2), $A_2$ represents a group containing a cyclic carbon structure.

7. The resist composition according to claim 1,
wherein (A) the resin containing a repeating unit represented by formula (I) contains a repeating unit having a lactone group or a repeating unit having an alicyclic group substituted by a hydroxyl group.

8. The resist composition according to claim 1,
wherein (B) the compound capable of generating an acid upon irradiation with actinic rays or radiation is selected from the group consisting of an oxime sulfonate and a diazodisulfone.

9. A pattern forming method, which comprises:
forming a resist film from a resist composition according to claim 1; and
exposing and developing the resist film.

10. The resist composition according to claim 1,
wherein the compound capable of generating a sulfonic acid upon irradiation with actinic rays or radiation is a diazonium salt, a phosphonium salt, a sulfonium salt, an iodonium salt, an imidosulfonate, an oxime sulfonate, a diazodisulfone, a disulfone or an o-nitrobenzylsulfonate.

11. The resist composition according to claim 1,
wherein (A) the resin containing a repeating unit represented by formula (I) further contains one or more of the following repeating units:

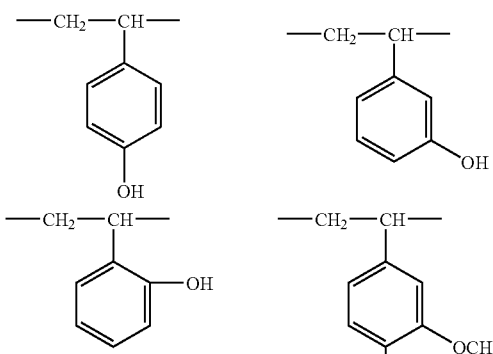

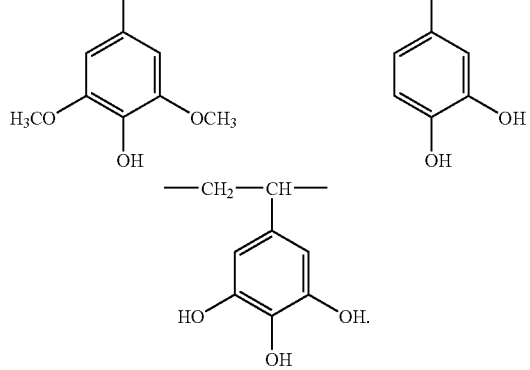

12. The resist composition according to claim 1, wherein Rn represents an alkyl group or a cycloalkyl group.

13. The resist composition according to claim 1, wherein AR represents an unsubstituted aryl group or an aryl group substituted by any of an alkyl group, an aryl group, an aralkyl group, an alkoxy group, a hydroxyl group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue.

14. The resist composition according to claim 13,
wherein (A) the resin containing a repeating unit represented by formula (I) further contains one or more of the following repeating units:

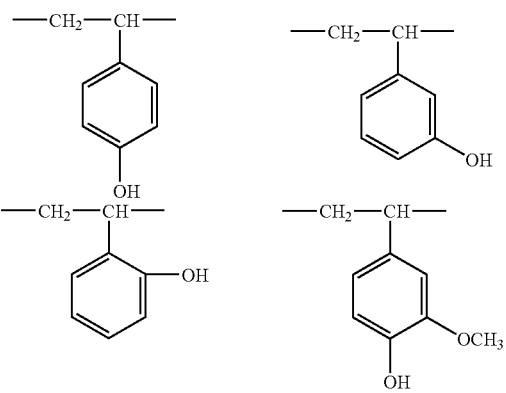

-continued

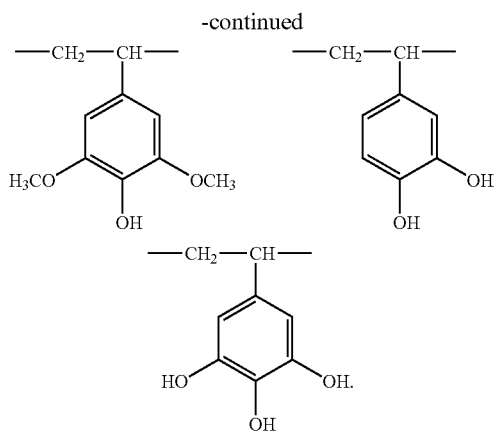

15. A resist composition, which comprises:

(A) a resin containing a repeating unit represented by formula (I); and (B) a compound capable of generating an acid upon irradiation with actinic rays or radiation, the resist composition being of the chemical amplification type:

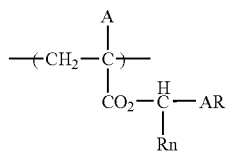
(I)

wherein AR represents an aryl group;

Rn represents an alkyl group, a cycloalkyl group or an aryl group; and

A represents an atom or group selected from the group consisting of a hydrogen atom, an alkyl group, a halogen atom, a cyano group and an alkyloxycarbonyl group, and wherein (A) the resin containing a repeating unit represented by formula (I) further contains one or more of the following repeating units:

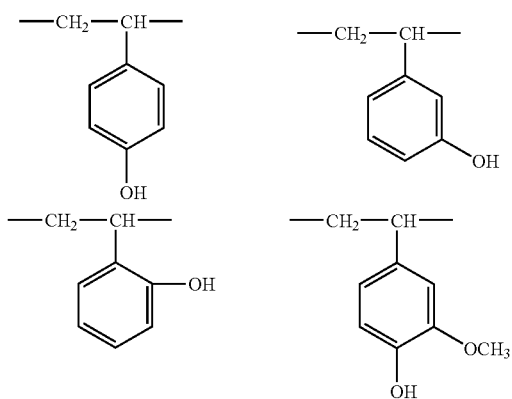

-continued

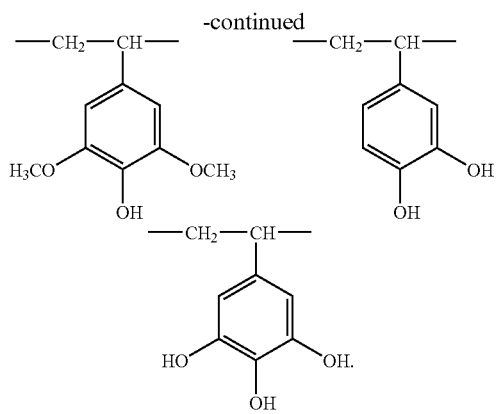

16. The resist composition according to claim 15, wherein (A) the resin containing a repeating unit represented by formula (I) further contains a repeating unit represented by formula (A1):

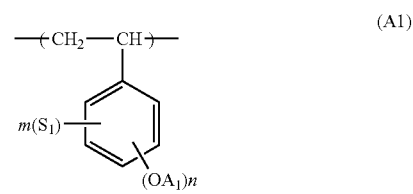
(A1)

wherein n represents an integer of 0 to 3;

m represents an integer of 0 to 3, provided that $m+n \leqq 5$;

$A_1$ represents a group capable of decomposing under an action of an acid or a group containing a group capable of decomposing under an action of an acid, and when a plurality of $A_1$s are present, the plurality of $A_1$s may be the same or different; and $S_1$ represents a substituent, and when a plurality of $S_1$s are present, the plurality of $S_1$s may be the same or different.

17. The resist composition according to claim 15, wherein (A) the resin containing a repeating unit represented by formula (I) further contains a repeating unit represented by formula (A2):

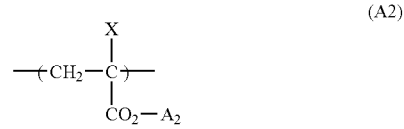
(A2)

wherein $A_2$ represents a group capable of decomposing under an action of an acid or a group containing a group capable of decomposing under an action of an acid; and X represents an atom or group selected from the group consisting of a hydrogen atom, an alkyl group, a halogen atom, a $CF_3$ group, a cyano group, an alkyloxycarbonyl group, an alkyloxycarbonylmethyl group, an alkylcarbonyloxymethyl group, a hydroxymethyl group and an alkoxymethyl group.

18. The resist composition according to claim 15, wherein (A) the resin containing a repeating unit represented by formula (I) contains a repeating unit having a lactone group or a repeating unit having an alicyclic group substituted by a hydroxyl group.

19. The resist composition according to claim 15, wherein AR represents an unsubstituted aryl group or an aryl group substituted by any of an alkyl group, an aryl group, an aralkyl group, an alkoxy group, a hydroxyl group, an acyl group, an acyloxy group, an acylamino group, a sulfonylamino group, an alkylthio group, an arylthio group, an aralkylthio group, a thiophenecarbonyloxy group, a thiophenemethylcarbonyloxy group and a heterocyclic residue.

* * * * *